United States Patent
Foote et al.

(10) Patent No.: US 9,800,229 B2
(45) Date of Patent: *Oct. 24, 2017

(54) PHASE ALIGNED INTERLEAVED SAMPLING OF MULTIPLE DATA CHANNELS

(71) Applicant: NATIONAL INSTRUMENTS CORPORATION, Austin, TX (US)

(72) Inventors: Garritt W. Foote, Austin, TX (US); Hector Rubio, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 466 days.

This patent is subject to a terminal disclaimer.

(21) Appl. No.: 14/267,274

(22) Filed: May 1, 2014

(65) Prior Publication Data

US 2014/0244705 A1    Aug. 28, 2014

Related U.S. Application Data

(62) Division of application No. 12/847,656, filed on Jul. 30, 2010, now Pat. No. 8,755,460.

(51) Int. Cl.
*H04B 1/10*  (2006.01)
*H03H 17/02* (2006.01)
*H03M 1/12*  (2006.01)

(52) U.S. Cl.
CPC ...... *H03H 17/0248* (2013.01); *H03M 1/1245* (2013.01); *H03M 1/1225* (2013.01)

(58) Field of Classification Search
CPC ......... H04L 25/0292; H04L 5/06; H04B 1/04; H03M 1/1225; H03M 1/1245; H04J 1/05

(Continued)

(56) References Cited

U.S. PATENT DOCUMENTS 5,357,257 A    10/1994  Nevin
5,377,248 A    12/1994  Brooks
(Continued)

OTHER PUBLICATIONS

"Understanding SAR ADCs: Application Note 1080"; Mar. 1, 2001; 6 pages; Maxim Integrated Products; retrieved from Internet: http://www.maxim-ic.com/an1080.

(Continued)

*Primary Examiner* — Leila Malek
(74) *Attorney, Agent, or Firm* — Meyertons Hood Kivlin Kowert & Goetzel, P.C.; Jeffrey C. Hood

(57) ABSTRACT

Provided is a method for processing data samples from a plurality of data channels. The method may include obtaining a plurality of data samples from the plurality of data channels. Obtaining the plurality of data samples may involve successively obtaining a data sample from each data channel of the plurality of data channels. Successively obtaining a data sample from each data channel may be performed a plurality of times during a specified time period. Each data sample of the plurality of data samples may be associated with a respective sample time, and each respective sample time may be relative to a single specified reference point in time. The method may further include, for each data sample of the plurality of data samples, determining a time-dependent coefficient value that may correspond to the sample time associated with the data sample, and applying the determined time-dependent coefficient value to the data sample.

20 Claims, 19 Drawing Sheets

(58) Field of Classification Search
USPC .......... 375/316, 260, 355, 349; 341/155; 370/302, 464, 484
See application file for complete search history.

(56) References Cited

U.S. PATENT DOCUMENTS

| | | | |
|---|---|---|---|
| 5,550,860 | A | 8/1996 | Georgiou et al. |
| 6,870,892 | B2 | 3/2005 | Strolle et al. |
| 7,023,938 | B1 * | 4/2006 | Kapoor ............ H04L 27/2647 375/222 |
| 7,265,694 | B2 | 9/2007 | Guidry |
| 7,408,491 | B2 | 8/2008 | Bock et al. |
| 8,438,015 | B2 * | 5/2013 | Schnell .................. 704/211 |
| 8,452,605 | B2 * | 5/2013 | Schnell .................. 704/211 |
| 2003/0105539 | A1 * | 6/2003 | Chang ................ H04S 1/007 700/94 |
| 2003/0185292 | A1 | 10/2003 | Fernandez-Corbaton et al. |
| 2004/0085237 | A1 | 5/2004 | Fossum et al. |
| 2007/0200840 | A1 | 8/2007 | Clynes et al. |
| 2009/0135035 | A1 | 5/2009 | Fifield |
| 2010/0188277 | A1 | 7/2010 | Aruga et al. |

OTHER PUBLICATIONS

Dan Lavry; "Sampling, Oversampling, Imaging and Aliasing—a basic tutorial"; 1997; 6 pages; Lavry Engineering; retrieved from Internet: http://www.lavryengineering.com/white_papers/sample.pdf.

M. Mottaghi-Dastjerdi, A. Afzali-Kusha, M. Pedram; "BZ-FAD: A Low-Power Low-Area Multiplier based on Shift-and-Add Architecture"; IEEE Transactions on Very Large Scale Integration (VLSI); Feb. 2009; vol. 17, Issue 2; pp. 302-306.

"Demystifying Sigma-Delta ADCs: Application Note 1870"; Jan. 31, 2003; 14 pages; Maxim Integrated Products; retrieved from Internet: http://www.maxim-ic.com/an1870.

* cited by examiner

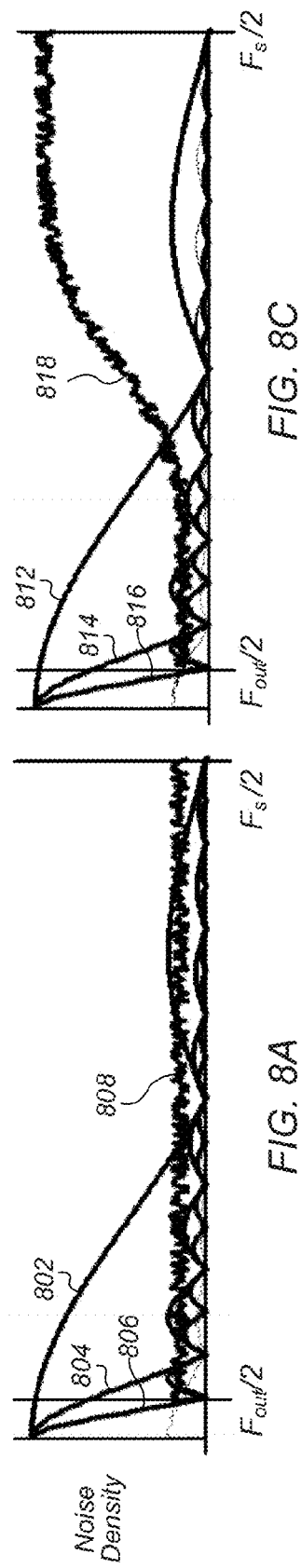

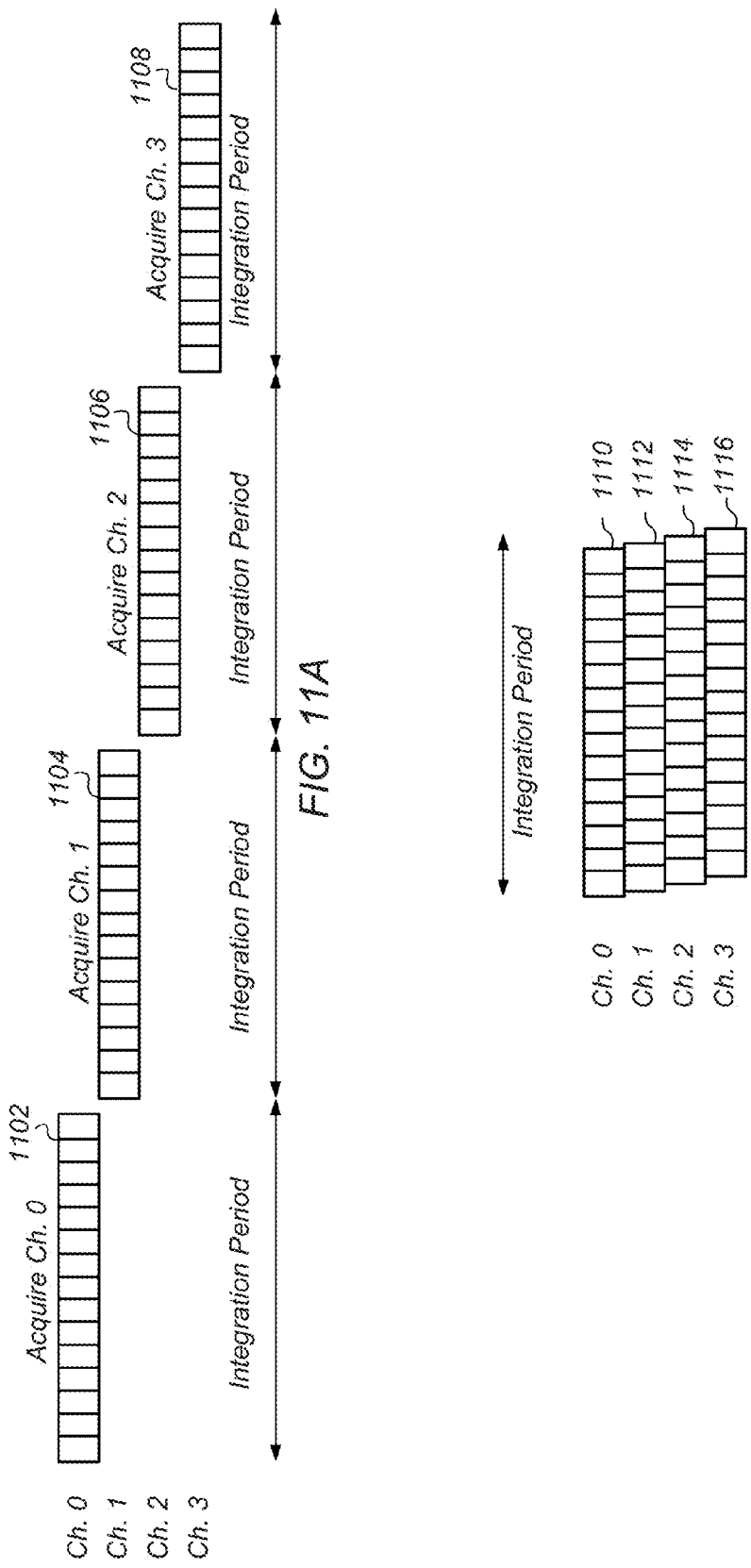

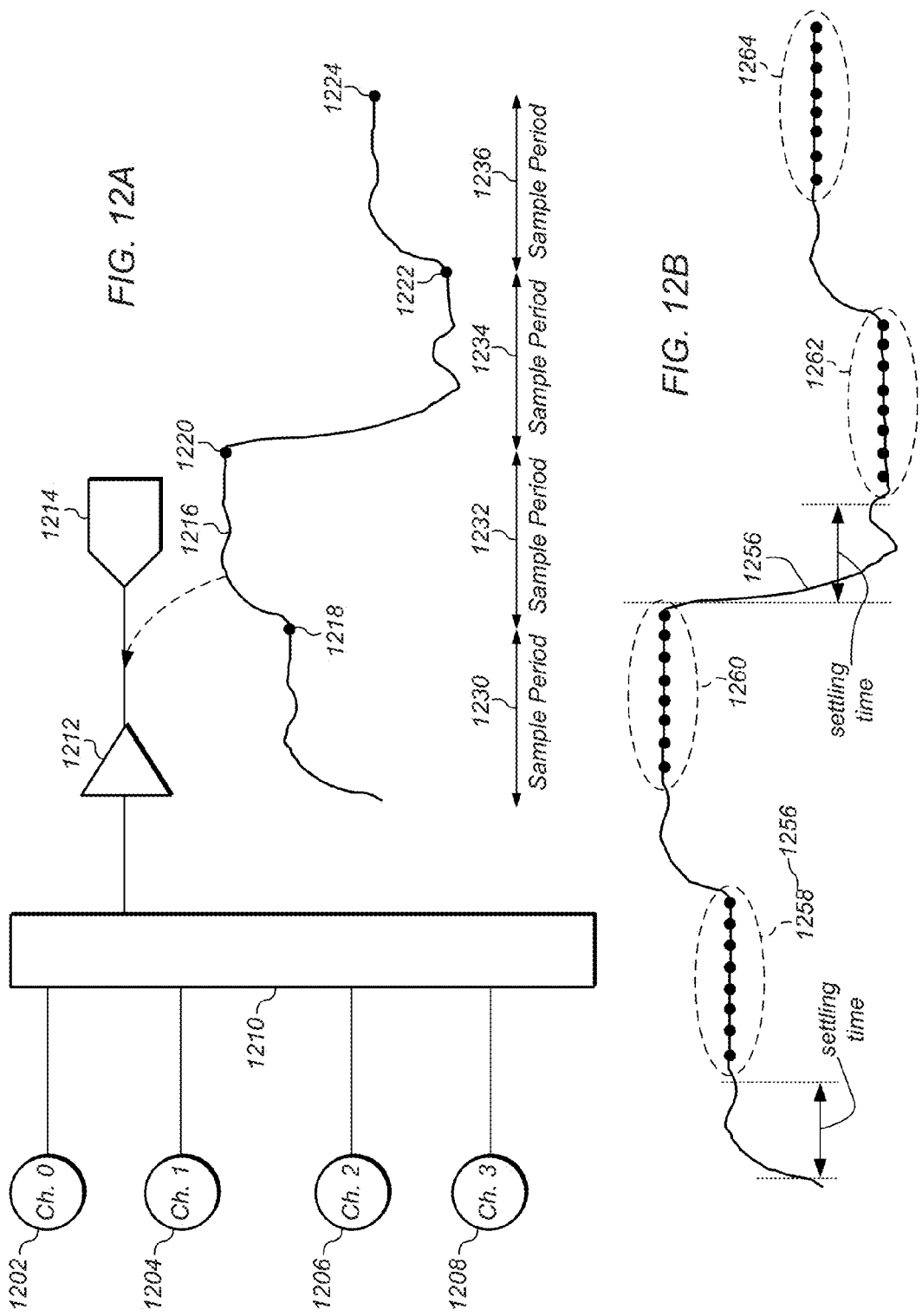

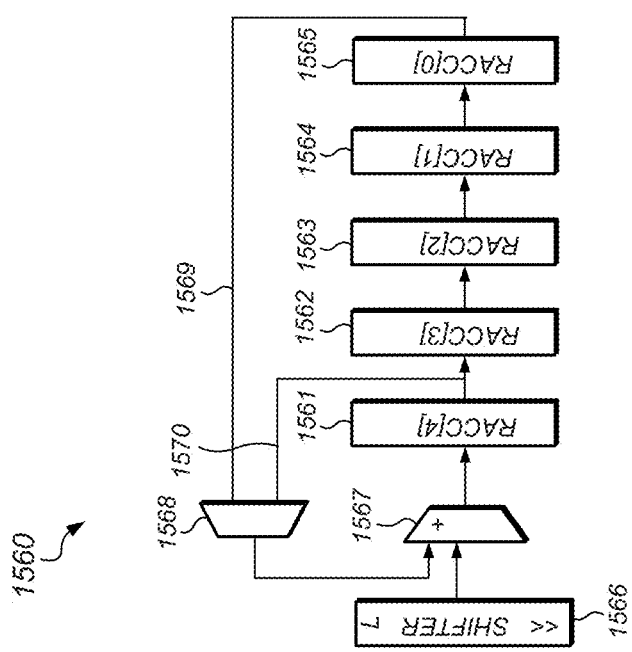

PHASE ALIGNED INTERLEAVED SAMPLING OF MULTIPLE DATA CHANNELS

PRIORITY DATA

This application is a divisional application of U.S. application Ser. No. 12/847,656 titled "Phase Aligned Sampling of Multiple Data Channels Using a Successive Approximation Register Converter" filed Jul. 30, 2010, whose inventors are Garritt W. Foote and Hector Rubio, and which is hereby incorporated by reference in its entirety as though fully and completely set forth herein.

FIELD OF THE INVENTION

This invention relates to a system and method of measuring and filtering one or more data channels using a successive approximation register converter.

DESCRIPTION OF THE RELATED ART

Delta-sigma modulators may be used in industrial and sensor measurement products to obtain high resolution analog-to-digital conversions and to eliminate cost, power, and usability issues associated with programmable gain amplifiers. And, since delta-sigma modulators integrate over a period of time, they may be a good choice to provide notch filtering of data to remove noise from power line harmonics. In some products (e.g., products intended for low-bandwidth applications) multiple data channels may be multiplexed into a single delta sigma ADC. In other products (e.g., higher cost products) each data channel (e.g., channel) may have a dedicated delta-sigma analog-to-digital converter (ADC) and amplifier chain for simultaneous, phase-matched measurements between channels.

However, for a variety of reasons (e.g., operational characteristics) it may be difficult to trade off power consumption, bandwidth and resolution in designs that use delta-sigma modulators. Also, the use of delta-sigma modulators may restrict advances in reducing response time, reducing power consumption and reducing inter-channel phase delay for power-line filtering applications. Lastly, in a single delta-sigma ADC system, it may be difficult to make effectively simultaneous measurements. Thus while delta-sigma converters may provide certain advantages to system designers they may also present certain problems.

Accordingly it may be desirable to provide a system and method for measuring and filtering one or more channels using a successive approximation register (SAR) converter.

SUMMARY OF THE INVENTION

Provided is a method for processing a plurality of data sets, where each data set of the plurality of data sets may comprise a plurality of data samples. In some embodiments, the method may include receiving, in a sequence, each data sample of the plurality of data sets. Additionally, adjacent data samples in the sequence may correspond to different coefficient values.

Receiving each data sample of the plurality of data sets may include receiving each data set through a different corresponding data channel of a plurality of data channels. The method may also include performing, for each received data sample, one or more of the following steps: determining a corresponding position within the sequence, identifying the corresponding data channel for each received data sample, obtaining a coefficient value corresponding to the determined corresponding position, and calculating, according to the obtained corresponding coefficient value, a weighted value corresponding to the data sample.

In certain embodiments, determining a corresponding position within the sequence, obtaining a coefficient value corresponding to the determined corresponding position and calculating a weighted value corresponding to the data sample may all be performed for a current data sample prior to receiving a next data sample of the plurality of data samples. Also, in some embodiments, each coefficient value may be different from a most recent previously determined coefficient value. According to some embodiments, adjacent data samples in the sequence correspond to different data channels of the plurality of data channels.

In certain embodiments, calculating a weighted value corresponding to the data sample may involve multiplying the received data sample by the obtained corresponding coefficient value to produce a weighted value corresponding to the data sample. And, obtaining a coefficient value may include obtaining a coefficient value corresponding to the identified corresponding data channel Also provided is a method for processing data samples from a plurality of data channels. The method may include obtaining a plurality of data samples from the plurality of data channels. Obtaining a plurality of data samples may involve successively obtaining a data sample from each data channel of the plurality of data channels and may involve receiving data samples of the plurality of data samples at a specified rate. Successively obtaining a data sample from each data channel may be performed a plurality of times during a specified time period. Also, successively obtaining a data sample from each data channel may include successively obtaining a data sample from each data channel in a specified order corresponding to a specified ordering of the plurality of data channels.

Each data sample of the plurality of data samples may be associated with a respective sample time, and each respective sample time may be relative to a single specified reference point in time. In some embodiments, the single specified reference point in time may be located within the specified time window and may correspond to the start of the specified time window. The method may further include, for each data sample of the plurality of data samples, determining a time-dependent coefficient value that may correspond to the sample time associated with the data sample, and applying the determined time-dependent coefficient value to the data sample. Also applying may involve multiplying the data sample by the respective time-varying coefficient value to produce a weighted data sample.

In certain embodiment, the method may also include generating, for each data channel of one or more data channels of the plurality of data channels, an effective data sample from two or more weighted data samples corresponding to the data channel. And generating may involve arithmetically combining the two or more weighted data samples.

Also provided is an apparatus for processing a sequence of data samples. In some embodiments the apparatus may include an input that may be configured to receive a sequence of data samples. And, the sequence of data samples may include at least one respective data sample from each data channel of an ordered set of two or more data channels. Also, the apparatus may include first circuitry that may be configured to identify a respective position, within the sequence of data samples, of each received data sample of the received sequence of data samples. Accordingly, the first circuitry may include a sample index register and, in order to identify a respective position of each received data sample of the received sequence of data samples, the first circuitry may be configured to set the sample index register to a specified value and then, for each received data sample, set the sample index register to a current value indicative of the number of data samples received since the index register was last set to the specified value. The specified value may be indicative of the respective position, within the sequence of data samples, of a leading data sample of the sequence of data samples.

In some embodiments, the apparatus may include coefficient circuitry that may be configured to produce a respective coefficient value for each received data sample according to the identified respective position of the received data sample. Producing the respective coefficient value for each received data sample may involve using the current value of the sample index register. And, for each of at least two successively received data samples of the received sequence of data samples, where each successively received data sample may correspond to a different respective data channel, the coefficient circuitry may be configured to produce a different respective coefficient value for each of at least two successively received data samples.

In certain embodiments, the apparatus may include computation circuitry that may be configured to calculate a respective weighted value for each received data sample according to the obtained respective coefficient value of the received data sample. And, to calculate a respective weighted value for each received data sample, the computation circuitry may be configured to multiply a data value corresponding to the received data sample with the produced respective coefficient value of the received data sample.

BRIEF DESCRIPTION OF THE DRAWINGS

A better understanding of embodiments of the present invention can be obtained when the following detailed description of the preferred embodiment is considered in conjunction with the following drawings, in which:

FIGS. 8A and 8C are charts respectfully illustrating filtering curves and noise levels in an SAR based system and a delta-sigma based system;

FIGS. 8B and 8D are charts, respectfully illustrating noise shaping in an SAR based system and a delta-sigma based system;

FIG. 11A is a diagram illustrating the sampling of data over four consecutive integration periods in a delta-sigma based system;

FIG. 11B is a diagram illustrating the sampling of data over four interleaved integration periods in a SAR based system according to various embodiments;

FIG. 12A is a diagram illustrating interleaved sampling with one sample taken per sample period;

FIG. 12B is a diagram illustrating interleaved sampling with multiple samples taken per sample period according to an embodiment;

FIGS. 15D and 15E respectfully depict multiply accumulator circuitry according to a second embodiment and accumulator contents during the processing of the sequence of data samples;

Figure 1:
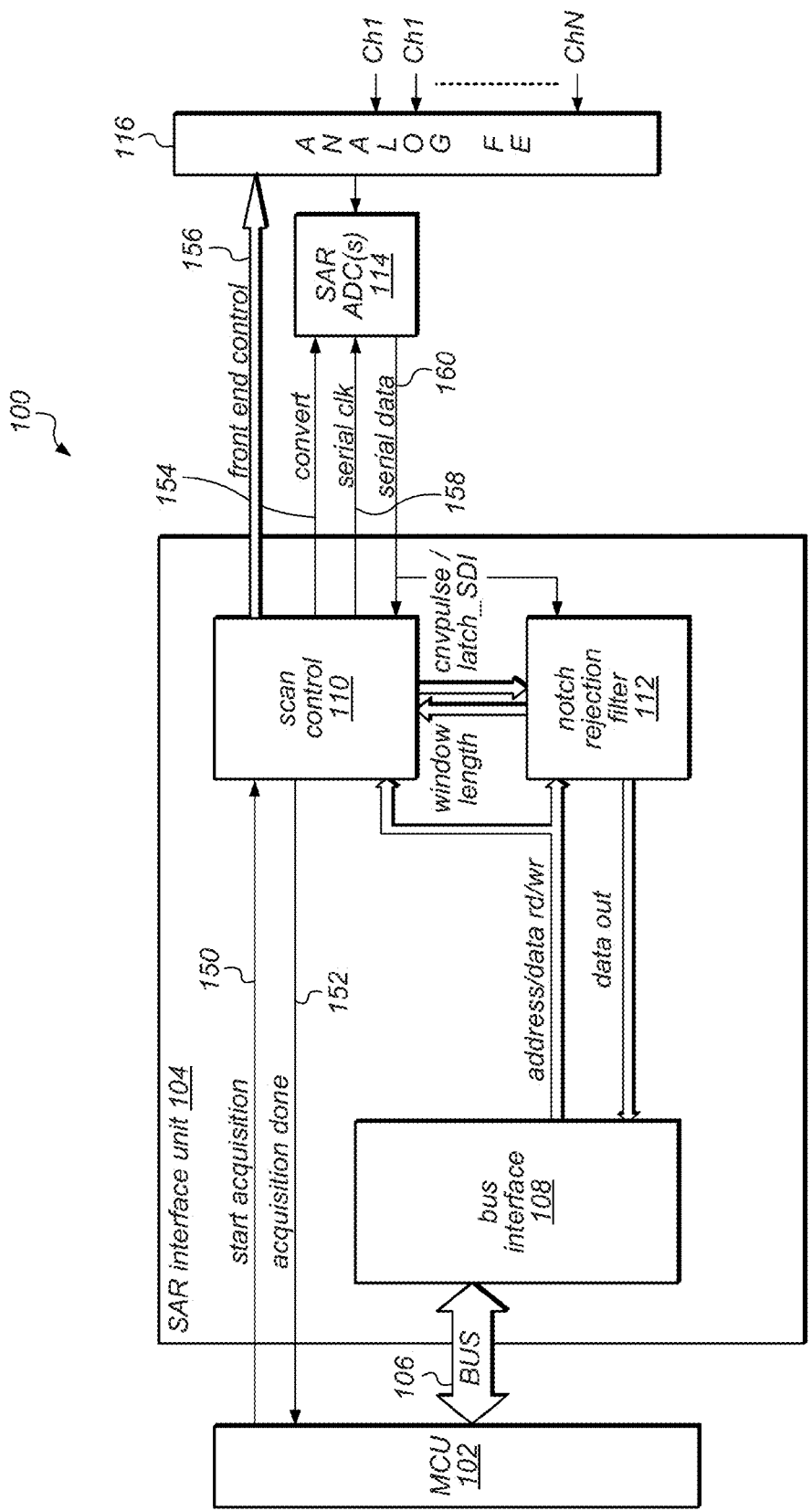
FIG. 1 is a diagram illustrating an analog-to-digital converter (ADC) system according to an embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Overview

In some embodiments, a successive approximation register (SAR) converter may be used in applications and systems that otherwise use delta-sigma converters to provide similar or improved performance (e.g., similarly high resolution) and to provide additional advantages. To this end, a SAR converter may be oversampled at a rate higher than an intended output data rate. Also, a SAR converter may be combined with logic to oversample and to average (or integrate) data samples before returning a resulting value as a useful output data value. A SAR converter, perhaps in association with combined logic, may provide a flexible converter circuit that may allow power, data rate, and resolution to be traded off for each other. Additional advantages of a SAR based solution may include faster response, lower power, and less inter-channel phase delay for power-line filtered applications. The SAR based solution may also enable effectively simultaneous multi-channel measurements with a single analog-to-digital converter (ADC) and multiplexed inputs. SAR converters may provide various advantages over delta-sigma modulators since, for example, the noise shaping of a delta-sigma modulator may limit the useful range of tradeoffs that may be made and so a delta-sigma based design may have less flexibility than a SAR based design Some embodiments may include one or more digital integrators to generate filter coefficients for various filter responses which may trade off power-line notch filter performance for integration time. In some embodiments, a single logic implementation of integrators may be used to generate various filter functions that may be convolutions of simple rectangular windows. Also, digital integrators may generate various filter functions that may be products of sin(x)/x responses. In certain embodiments, filter coefficients may be generated according to eliminating the need for memory or look-up tables.

In certain embodiments, an ADC serial interface may be coupled to a shift-and-add multiplier so the multiplication of filter coefficients with ADC values may be accomplished without the use of a more costly hardware multiplier. The multiplication may be performed by shifting the coefficient value with each ADC serial clock and either adding it into an accumulator or not based on the next bit value of the ADC data.

According to some embodiments, multiple channels may be scanned (e.g., interleaved) over a single integration period and samples may be averaged as each sample is taken. Within a single integration period measurements may be obtained for all channels with power-line notch filter rejection that is dictated by the length of the period. This may be contrasted with delta-sigma based designs in which only one channel may be sampled per integration period. This approach may enable data to be obtained at similar (e.g., equal) rate to a comparable design featuring a delta-sigma and amplifier chain per channel, but at substantially lower cost and power.

Some embodiments may support an ADC operating with "burst mode" timing. In this mode, extra time may be provided for a relatively low power amplifier to settle and then multiple samples of data may be obtained at a high rate before switching to a new channel and repeating the process. This timing method may enable the use of low power amplifier with a relatively fast ADC. This approach may enable the design and construction of more cost effective solutions and may also allow lower cost products (e.g., slow settling amplifiers) to be used in systems that previously required higher cost versions (e.g., fast settling amplifiers).

In certain embodiments, a weighting function may be applied to multiple channels that may not be identical for each channel (e.g., weighting coefficients applied to one channel may differ from weighting samples applied to a different channel). Instead, the weighting function may increment according to a single master weighting function with each channel change. By supplying each channel with a different, asymmetrical weighting function the multiple channels may be effectively phase aligned. This may allow a single amplifier and ADC with multiplexed input channels to have the phase aligned characteristics of a more expensive system (e.g., a system with an amplifier and converter per channel).

FIG. 1

FIG. 1 depicts an analog to digital converter system 100 according to various embodiments. System 100 may include SAR ADC 114, analog front-end 116, SAR interface unit 104, microcontroller unit 102 and bus 106. Analog front-end 116 may be connected to plurality of analog channels (e.g., channels "Ch1 . . . ChN"). Analog front-end 116 may act as a multiplexer and may provide an analog signal (e.g., an analog signal from a selected one of channels "Ch1 . . . ChN", an amplified analog signal, an output analog signal) to SAR ADC 114. SAR ADC 114 may sample the analog signal (e.g., regularly, in response to receiving a convert signal), convert the analog signal to a digital sample (e.g. digital representation, a digital value) and output the digital sample (e.g., output serially, output as part of a series or sequence of data samples, output as part of a data stream) to SAR interface unit 104. SAR interface unit 104 may filter and/or average data samples received and provide corresponding measurements to microcontroller unit (MCU) 102.

SAR interface unit 104 may include, for example, bus interface 108, scan control 110 and notch rejection filter (NRF) 112. MCU 102 may instruct (e.g., via signal start acquisition 150) the scan control 110 to commence data acquisition. MCU 102 may also configure the acquisition by, for example, writing (e.g., via bus 106 and bus interface 108) to scan control 110. MCU 102 may configure the acquisition by writing to control structures of scan control 110 and/or issuing commands to scan control 110. Configuring the acquisition may involve, for example, MCU 102 specifying one or more of the following: channels to be sampled, sampling rates, oversampling rates, filter functions, filter orders, multiplexing schemes.

Scan control 110 may drive (e.g., generate, output, control) signals (e.g., control signals, clocks) that may coordinate and control other system components (e.g., SAR ADC 114, analog front end 116 and NRF 112) so that acquisition and filtering may be properly carried out. For example, scan control 110 may drive front end control 156 (e.g., front end control signals, front end control bus) so that the appropriate channel (e.g., one of Ch1 to ChN) is selected at the appropriate time. For example, front end control 156 may carry information that may be used to control a channel select multiplexer within analog front end 116.

Scan control 110 may also generate a convert signal output (e.g., on convert 154) to instruct SAR ADC 114 to perform a conversion (e.g., take a sample, sample an analog signal). Scan control 110 may also provide a serial clock (e.g., a clock for serial communications, a clock driven on serial clk 158) to SAR ADC 114 and receive ADC serial data (e.g., on serial data 160) that may be clocked by the provided serial clock.

Also, scan control 110 may receive inputs (e.g., configuration inputs) from NRF 112 and may send signals (e.g., control signals, data) to NRF 112. For example, NRF 112 may provide a window length input to scan control 110 (e.g., to inform scan control 110 of the length of a filter window to be used). Scan control 110 may output a convert pulse signal (e.g., a pulsed signal that may correspond to convert signal 154) to NRF 112 (e.g., to notify NRF 112 that new sample data may arrive). Scan control 110 may also generate and output a latch control signal (e.g., latch_SDI) which may be used by NRF 112 to capture ADC serial data (e.g., data samples from the ADC, data samples transmitted on serial data 160).

NRF 112 may process received ADC serial data (e.g., according to configuration settings, according to a selected filter) and may supply processed (e.g., filtered, weighted) data to bus interface 108 (e.g., in response to a read by MCU 102). Data may be supplied to bus interface 108, via data out signals. MCU 102, or some other device that may be connected to SAR interface unit 104, may obtain (e.g., by reading, by requesting) ADC data (e.g., ADC filtered data) from SAR interface unit 104 (e.g., from NRF 112). In some embodiments, MCU 102, or another connected device, may obtain ADC data through bus transactions (e.g., bus reads, direct memory access reads) on bus 106, and these transactions on bus 106 may be converted (e.g., translated) into bus transactions between bus interface 108 and NRF 112 (e.g., on depicted signal lines address/data, rd/wr, data out; on internal bus lines). When an acquisition is complete, scan control 110 may signal completion to MCU 102 by asserting signal acquisition done 152.

FIG. 2

Figure 2:
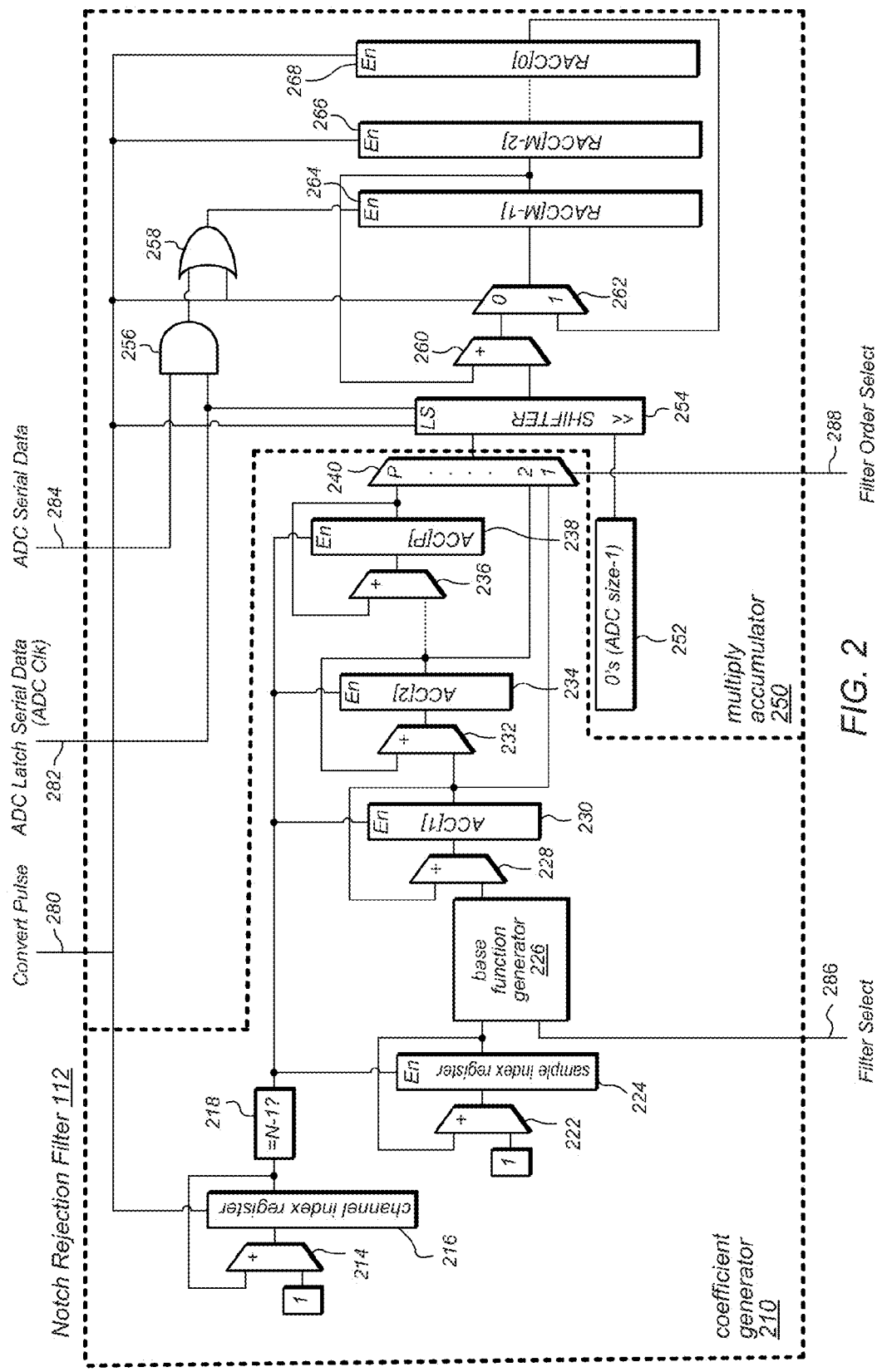
FIG. 2 is a block diagram of a notch rejection filter according to an embodiment.

FIG. 2 illustrates NRF 112 according to some embodiments. Depicted NRF 112 may represent an embodiment that may process a data stream that may be formed by interleaving data samples from different channels. For clarity, circuitry that may allow NRF 112 to support other operational modes (e.g., a mode that processes a data stream from a single channel) is not shown. In certain embodiments, mode switching logic may affect relations between channel index register 216 and the sample index register 224. The implementation depicted in FIG. 2 assumes SAR ADC 114 returns the most significant bit (MSB) of data first (e.g., to NRF 112) but in other embodiments the least significant bit (LSB) of data may be returned first. In the depicted embodiment the maximum order of the implemented filters may be represented by "P" and the number of channels may be represented by "N". The values of "P" or "N" are positive integers and may vary depending on the embodiment. For example, in embodiments where the filter order is the same as the number of channels, "P" will equal "N". Overall, the respective values of "P" and "N" may be specified or selected according to the requirements and specifications of each system and/or application.

As depicted in FIG. 2, some embodiments of NRF 112 may comprise several sub-blocks. For example, NRF 122 may comprise a coefficient generator (CG) 210 and a multiply accumulator (MAC) 250. NRF 112 may also comprise various inputs which may include for example, Filter Select 286. This input may be used, for example, to select a filter window to be applied. Another input may be Filter Order Select 288, which may be used to specify the order of the selected filter window selected. In certain embodiments, the order of the selected filter may be obtained from a look-up table (LUT), where the LUT may be stored in memory (e.g., a random access memory—RAM, a read-only memory—ROM, a non-volatile RAM—NVRAM, a Flash ROM, as combination logic) and where a LUT entry corresponding to a selected filter may provide the order of the selected filter. The input Convert Pulse 280 may be provided on certain embodiments, and Convert Pulse 280 may, for example, carry a pulsed version of the convert signal 154 that is sent to the ADC 114. A convert signal received at input Convert Pulse 280 may mark the start of a new data sample/acquisition. ADC data may be provided (e.g., serially) to NRF 112 on input ADC Serial Data 284 and, as previously mentioned, serial data may be provided MSB bit first. Another input may be ADC Latch Serial Data 282. The input ADC Latch Serial Data 282 may tell NRF 112 when to latch the data provided at input ADC Serial Data 284. In certain embodiments, the serial clock signal 158 sent to the ADC 114 may be applied to input ADC Latch Serial Data 282. In some embodiments, the time between a convert pulse being received on input Convert Pulse 280 and a corresponding first data bit being received on ADC Serial Data 284 may be large enough to enable a filter constant to be generated and be made available. For example, for a maximum filter order of P, the first data bit may be supplied at least P+1 clocks after a corresponding convert pulse is received.

Coefficient Generator

CG 210 may, in some embodiments, include some or all of the following components. As depicted in FIG. 2, coefficient generator 210 may include a channel index counter that may increment on every convert pulse (e.g., every convert pulse received on input Convert Pulse 280) and may reset (e.g., to zero) on specified occasions (e.g., when the count value reaches the number of channels minus one). Thus, the channel index counter may effectively count through each channel. As in the depicted embodiment, the channel index counter may include adder 214 coupled to channel index register 216. Adder 214 may be used to increment the value of channel index register 216 in response to a convert pulse being received on input Convert Pulse 280. In certain embodiments where the number of channels may be a power of two, channel index register 216 may be reset through a normal counter overflow and no extra reset logic may be involved. CG 210 may also include channel index comparator 218 which may compare the value of channel index register 216 against a specified value (e.g., maximum channel count value, "N−1") and, when there is a match, generate an update signal (e.g., an update enable signal) for use in coefficient generator 210.

As depicted in FIG. 2, CG 210 may include a sample index counter that may count every "N" channels (e.g., every sample aggregate) and so the sample index counter may be able indicate (e.g., track, output, supply) the current tap in the filter window. The sample index counter may include sample index register 224 coupled to adder 222 and channel index comparator 218. In some implementations, sample index register 224 may be updated upon receiving an update signal (e.g., from channel index comparator 218).

According to some embodiments, CG 210 may also include base function generator 226. Base function generator 226 may be coupled to the output of sample index register 224 and to input Filter Select 286. In certain embodiments, base function generator 226 may include a LUT and each output value of base function generator 226 may correspond to a selected entry in the LUT. LUT entries may be selected based on the output of sample index register 224 and the value of input Filter Select 286. In certain embodiments, the LUT of base function generator 226 may be implemented as combinational logic coupled to the output of sample index register 224 and input Filter Select 286 or the LUT may be implemented as a table in non-volatile memory (e.g., read-only memory, Flash memory).

In some embodiments the base function generator may generate a series (e.g., a sequence) of data values corresponding to a base function and the base function may be a specified order derivative of a filter function (e.g., a weighting function, a coefficient function). The specified order derivative function may comprise scaled unit delta functions separated by zero values. The series of data values output by the base function generator may correspond to the values of the scaled delta functions (e.g., 4, 7, 1, 3) separated by significant numbers of consecutive zero values (e.g., by ten consecutive zeros, by 43 consecutive zeros, by 235 consecutive zeros). According to some embodiments, base function generator 226 may comprise a counter. The counter may count (e.g., in parallel to the sample index counter) the number of zeros between deltas stored in a smaller LUT or ROM and output the stored value of the delta when it reaches its terminal count.

In certain embodiments, coefficient generator 210 may include one or more accumulators. In the depicted embodiment, coefficient generator 210 may include "P" accumulators. Each accumulator of the "P" accumulators may comprise an accumulator register and coupled adder circuitry. For example, in FIG. 2, accumulator "1" may comprise accumulator register ACC[1] 230 and adjoining adder circuitry 228, accumulator "2" may comprise accumulator register ACC[2] 234 and adjoining adder circuitry 232 and so on up to accumulator "P" which may comprise accumulator register ACC[P] 238 and adjoining adder circuitry 236. Note that, for reasons of clarity, accumulators "2" to "P−1" are not depicted in FIG. 2. Each accumulator (and corresponding accumulator register) may comprise a data input, data output, clock input and enable input. The accumulators may be coupled to form a series (e.g., chain, sequence) of accumulators, where the data output of one accumulator may connect to the data input of a successive adjoining accumulator (e.g., to the input of an adder in the successive adjoining accumulator).

This arrangement may allow, for example, the output of each accumulator (e.g., accumulator register) in the series of accumulators (except the last accumulator in the series) to be added to the contents of the next respective accumulator in the series and the updated value stored in the next respective accumulator in the series. For example, adder 232 of accumulator "2" may add the value presented on the data output of accumulator "1" (e.g., the contents of accumulator register ACC[1] 230) to the current value of accumulator "2" (e.g., the contents of accumulator register ACC[2] 234) and store the updated value into accumulator "2" (e.g., into accumulator register ACC[2] 234).

An input to the first accumulator in the chain (e.g. an input to adder 228) may be driven by an output of base function generator 226. In some embodiments, the chain of accumulators may be used to integrate the output of base function generator 226 (e.g., when the base function corresponds to a specified order derivative of a weighting function) in order to generate a series of filter coefficients. The coefficient generator may support (e.g., generate coefficients for) various base functions and each supported base function may correspond to a different order derivative of a weighting function. For example, a first base function may correspond to a fourth order derivative of a first weighting function and a second base function may correspond to a sixth order derivate of a second weighting function.

Each successive accumulator in the series of accumulators may correspond to successively higher order integral of the base function. So, for example accumulator "1" may correspond to a first order integral of the base function, accumulator "2" may correspond to a second order integral of the base function and accumulator "P" may correspond to a "Pth" order integral of the base function. Each accumulator in the series of accumulators may output a series of values corresponding to a series values output by the base function generator. For example, the base function generator may output a sequence of values corresponding to a $5^{th}$ order derivative of a first weighting function and the fifth accumulator in the series (e.g., accumulator "5") may output sequence of values that corresponds to a $5^{th}$ order integral of $5^{th}$ order derivative of the first weighting function (e.g., that corresponds to the first weighting function). Consequently, the fifth accumulator may output a sequence of values corresponding to the first weighting function itself. Similarly, the base function generator may output a sequence of values corresponding to a $3^{rd}$ order derivative of a second weighting function and the third accumulator in the series (e.g., accumulator "3") may output a sequence of values that corresponds to a $3^{rd}$ order integral of $3^{rd}$ order derivative of the second weighting function (e.g., that corresponds to the second weighting function).

The output of each accumulator (e.g., accumulator registers ACC[1] to ACC[P]) may be coupled to an input of multiplexer 240 and a control input of multiplexer 240 may be coupled to Filter Order Select 288. Thus, in certain embodiments, the order of the selected filter may be used to select which accumulator (e.g., which accumulator data output) will form the coefficient output of coefficient generator 210 to multiply accumulator 250. Note that in some embodiments, "P" may correspond to the maximum order of filter supported by the embodiment.

Multiply Accumulator

As depicted in FIG. 2, some embodiments of multiply accumulator 250 may include shifter 254, adder 260, multiplexer 262 and "M" result accumulators including result accumulators RACC[M−1] 264, RACC[M−2] 266 to RACC[0] 268. Note that shifter 254, adder 260 and multiplexer 262 represent one or more embodiments capable of performing mathematical operations (e.g. multiply-accumulate) on data (e.g., samples). However, other circuitry may be used (e.g. a multiplier unit, an arithmetic unit, a logical unit) and the circuitry used (e.g. adder 260) may be capable of performing a range of functions (e.g., functions such as add, subtract, limit, round, or, AND, NOR, NAND, etc.)

Note that "M" may be equal to or greater than "N" where "N" may represent the number of channels in the system and where "N" may be an integer greater than or equal to two. For reasons of clarity, result accumulators RACC[M−3] to RACC[1] are not depicted. When a new filter coefficient is generated (e.g., by coefficient generator 210), it may be loaded in shifter 254 at a shifted (e.g., offset) position. The shifted position may correspond to the value of ADC resolution minus one and the shift may equate to multiplying the coefficient by a factor of 2^[ADC Resolution−1]. This multiplication factor (e.g. 2^[ADC Resolution−1]) may correspond to the positional value of the MSB of data items received from ADC 112. If the MSB of a data item received from ADC 112 is set to one, the shifted coefficient value may be added to the contents of RACC [M−1] 264. If the MSB of a data item received from ADC 112 is set to zero, the shifted coefficient value may not be added to the contents of RACC[M−1] 264. After a coefficient value is loaded (e.g., at an offset position) in shifter 254, whenever a next data item bit is latched (e.g., latched from ADC Serial Data 284), the coefficient value held in shifter 254 may be shifted right (down) one bit in order to update the value of the multiplication according to the value of the next bit to be shifted from the ADC. Note that multiplexer 240 may be used to select which accumulator in CG 210 may provide filter coefficient.

As previously mentioned, multiply accumulator 250 may include result accumulator RACC[M−1], where M is equal to or greater than N (the number of channels in the system). This register (e.g., RACC[M−1] 264) may hold the result of each multiply-accumulate operation in the circuit.

In certain embodiments, the updating of RACC[M−1] 264 (e.g., to store results of a multiply-accumulate operation) may be enabled (or not) depending on the value of a data bit that may be in the process of being latched from input ADC Serial Data 284. For example, in certain embodiments, RACC[M−1] 264 may be updated if ADC Serial Data 284 is driven high and the input ADC Latch Serial Data 282 transitions from low to high (e.g., transitions to latch the data). In one embodiment, the "AND" function may be implemented using circuitry (e.g. AND gate 256). If RACC [M−1] 264 is enabled for update, the current value of RACC[M−1] 264 may be added (e.g., by adder 260) to the value of shifter 254 and the result stored back into RACC [M−1] 264. By this or other means, a multiply and accumulate operation may be implemented without storing the value read from ADC 114 (e.g., a data item received on input ADC Serial Data 284).

Whenever a new channel is converted, the value of register RACC[M−1] 264 may be stored in the next register (e.g. RACC[M−2] 266) and the oldest value calculated (e.g., the value corresponding to the next channel in sequence, the value stored in RACC[0] 268) may be loaded into RACC [M−1] 264 so that it may be used for the next multiply and accumulate operation (e.g., with the next value read from ADC 114). Multiplexer 262 may be used to select the input to RACC[M−1] 264. For multiply-accumulate updates, multiplexer 262 may select the output of adder 260 as the input to RACC[M−1] 264. Alternatively, when there is a change of channel (e.g., indicated by input Convert Pulse 280 being driven high), multiplexer 262 may select the output of RACC[0] 268 as the input to RACC[M−1] 264. In one embodiment, "OR" circuitry 258 may enable RACC[M−1] 264 to be updated from adder 260 or to receive a change of channel value from RACC[0] 268. In some embodiments, accumulator registers RACC[M−1] 264 to RACC[0] 268 may be used to hold the data values for all the channels (the channel currently being processed may be held in RACC [M−1] 264) so only one multiply and accumulate circuit may be needed for all the channels. In some embodiments, data may be rotated (e.g. every time a new channel is selected) through registers RACC[M−1] 264 to RACC[0] 268 in sequence with data items (from different channels) arriving from ADC 114. Thus, some embodiments may not utilize a multiplexer to route channel data held in other registers (e.g., RACC[M−2] 266 to RACC[0] 268) to the multiply-and-add circuit. In some embodiments, by the end of a scan (e.g. when sample index register 244 holds a value corresponding to the filter window size, when channel index register 216 equals "N−1") the filter results may be ordered by channel in the result accumulation register RACC[M−1: 0] according to their index.

Filter Window Design

A notch rejection filter window may be a rectangular filter window (e.g., a rectangular filter window of length T) which may have a low pass frequency response and which may reject frequencies that are an integer multiples of a target frequency (e.g., $F_0=1/T$). Notch rejection at two frequencies (e.g., $F_A$ and $F_B$) may be provided by the same filter by convolving, in the time domain, two rectangle filter windows of different lengths (e.g., one rectangular filter window may be of length $T_A=1/F_A$ and one rectangular filter window may be of length $T_B=1/F_B$). This convolved filter window may have rejection notches at frequencies that are multiples of $F_A$ and rejection notches at frequencies that are multiples of $F_B$. The length of the filter window may be the sum of the two window lengths (e.g., equal to $T_A+T_B$) and so may be smaller and more energy efficient than a rectangular filter window of length that is the least common multiple of the two frequencies (e.g., the frequency that equals both $n*T_A$ and $m*T_B$, where n and m are positive integers). Furthermore, if it is beneficial to have higher rejection (e.g., wider notches) at a target frequency (e.g., frequency $F_A$), two rectangular windows of the same length (e.g., of length $T_A=1/F_A$) may be convolved to get a frequency response with a rejection that may be twice as big (in logarithmic scale) at the target frequency. In this case, the length of the filter window may be twice the period of the target frequency (e.g. $2*T_A$). These two concepts may be used in combination to generate a filter window with as many rejection frequencies (e.g., rejection notches) and rejection magnitude per frequency (e.g., rejection notch widths) as needed. The total "order" of a filter constructed like this may determined by the number of rectangular filter windows that were convolved with each other to generate the desired filter window.

The following figures (e.g., FIGS. 3A-7B) are charts depicting filter windows and their corresponding frequency responses for both exemplary rectangular filter windows and for exemplary filter windows corresponding to convolutions of multiple rectangular filter windows. These examples use a sample rate of 8192 Hz, a discrete time convolution over the sampled windows and a normalized frequency response.

Figure 3A:
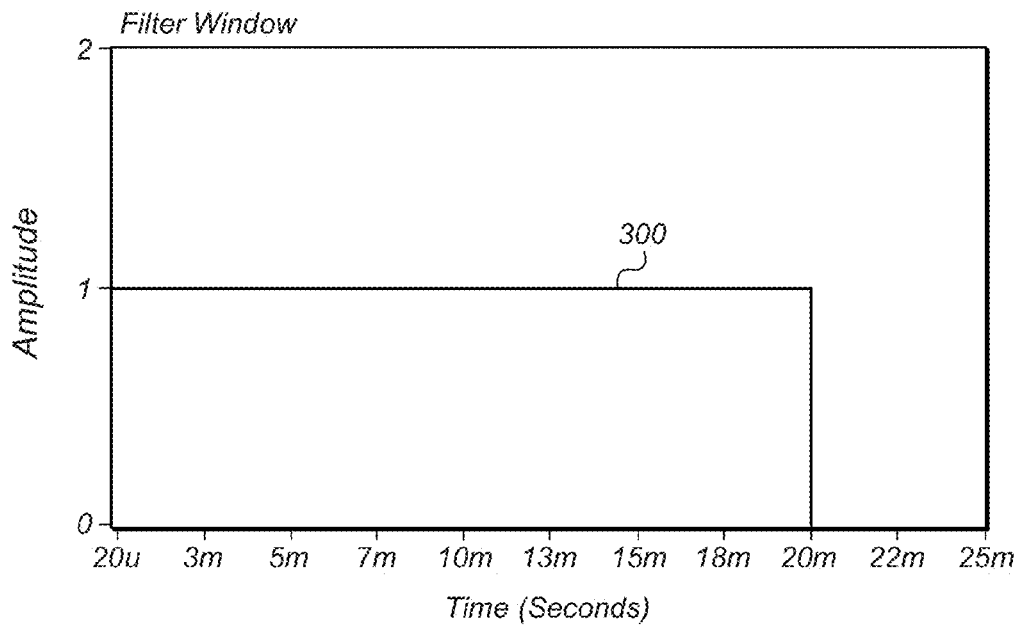
FIGS. 3A and 3B are charts, respectively showing a time domain representation and a frequency response curve of a 20 mS unit rectangular filter window.
Figure 3B:
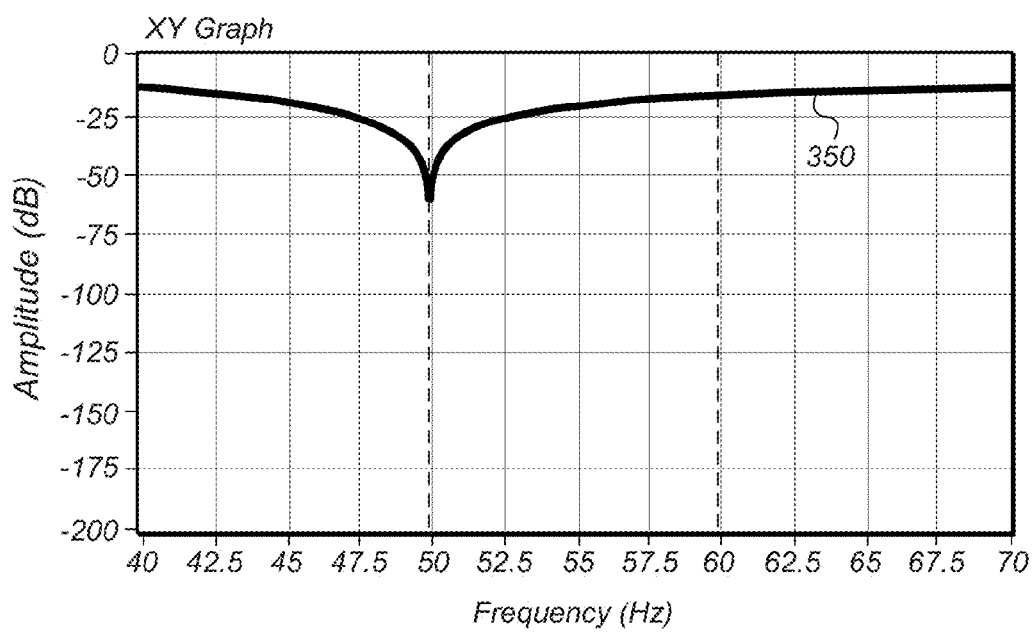

FIG. 3A depicts a time domain representation of a rectangular filter window 300 of length 20 mS and unit amplitude. FIG. 3B depicts a frequency response curve 350 that may correspond to filter window 300. Note the notch in frequency response curve 350 at a 50 Hz, the notch frequency corresponding to the reciprocal of the length of the rectangular filter window (e.g., 20 mS).

Figure 4A:
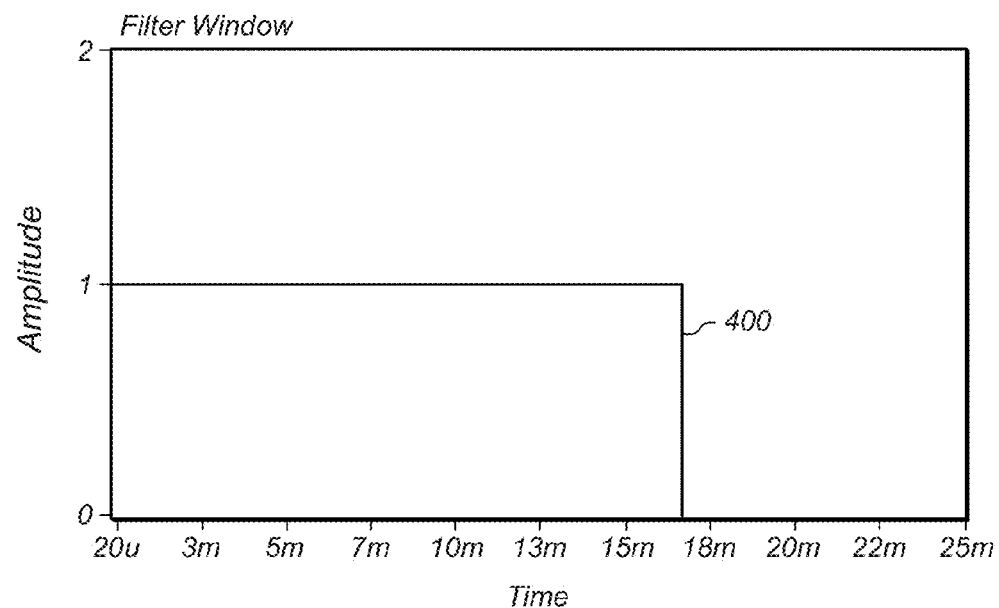
FIGS. 4A and 4B are charts, respectively showing a time domain representation and frequency response curve of a 16.6 mS unit rectangular filter window.
Figure 4B:
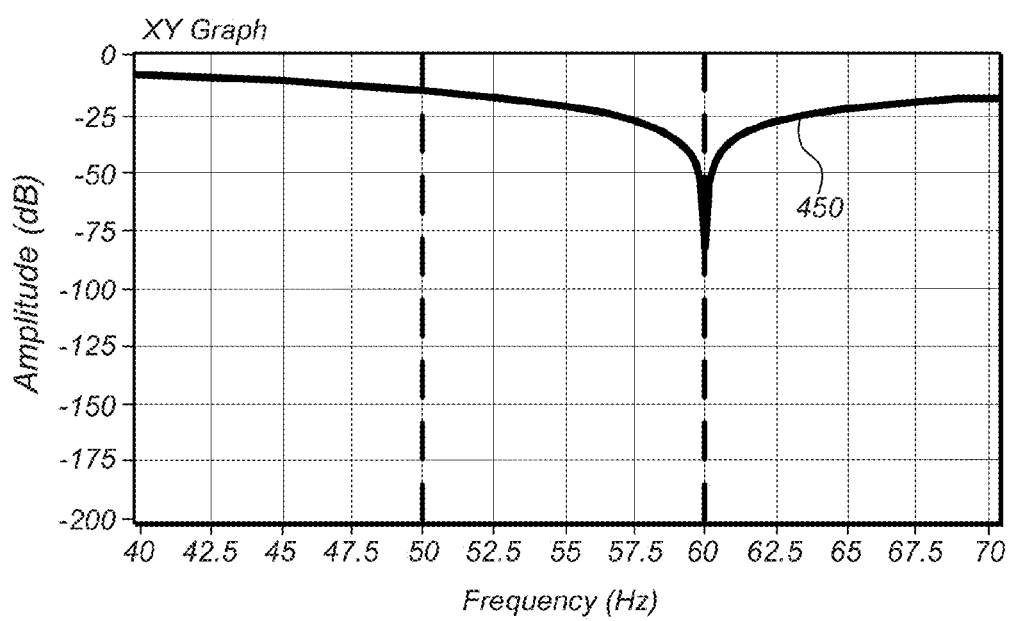

FIG. 4A depicts a time domain representation of a rectangular filter window 400 of length 16.67 mS and unit amplitude. FIG. 4B depicts a frequency response curve 450 that may correspond to filter window 400. Note the notch in the frequency response curve 450 at 60 Hz corresponds to the reciprocal of the length of the rectangular filter window length (e.g., 16.67 mS).

Figure 5A:
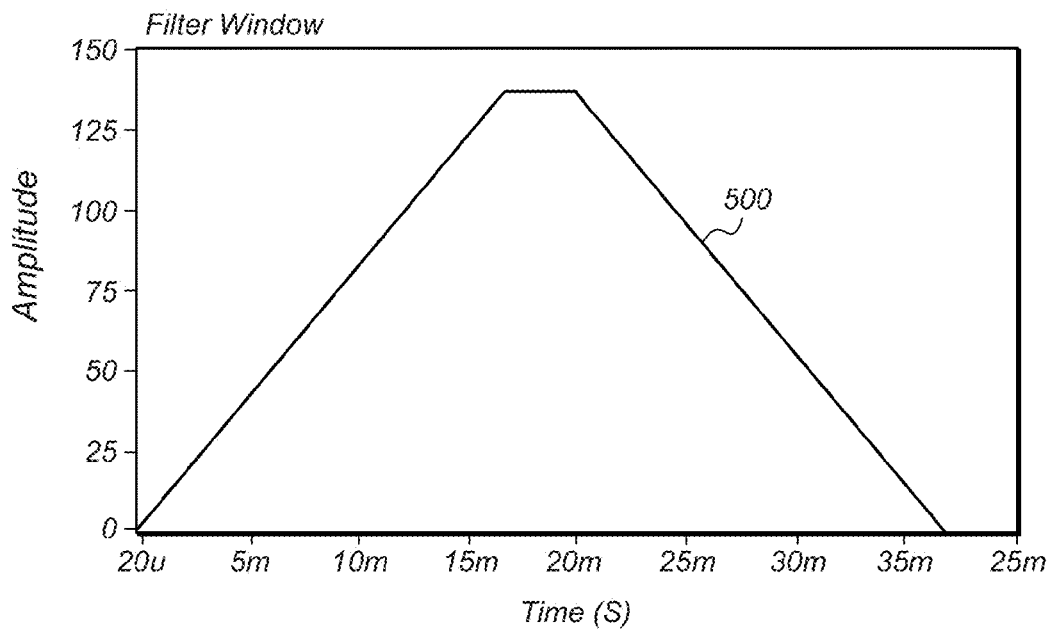
FIGS. 5A and 5B are charts, respectively showing a time domain representation and a frequency response curve for a second order convolution of a 16.6 mS unit rectangular filter window and a 20 mS unit rectangular filter window.
Figure 5B:
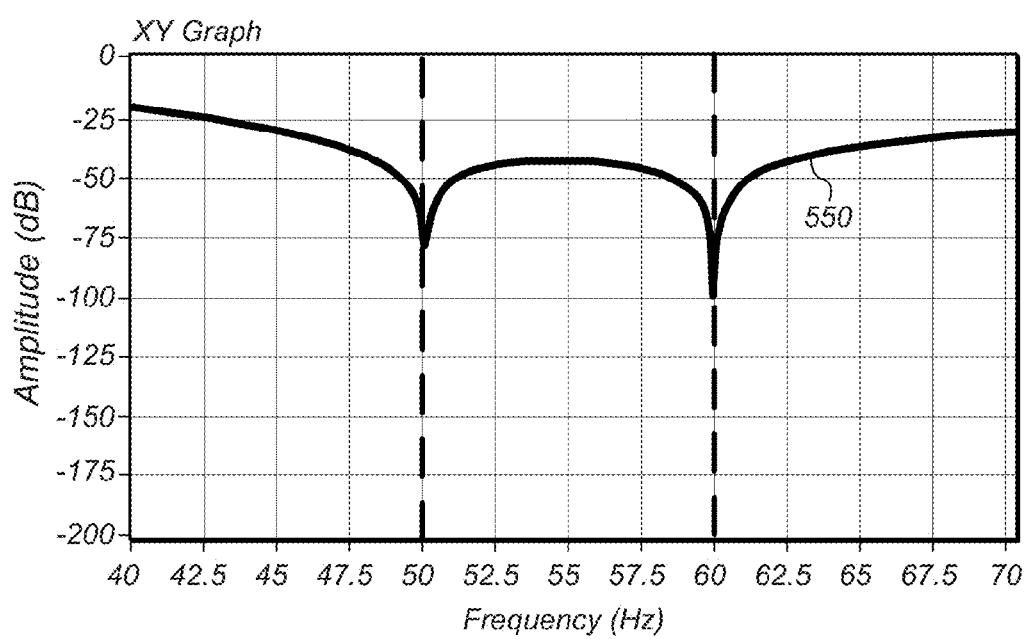

FIG. 5A depicts a time domain representation of a filter window 500 of length 36.67 mS (e.g., 300 integer coefficients generated at 8192 samples/s) and maximum amplitude of approximately 136. Filter window 500 may be produced by convolving rectangular filter window 300 and rectangular filter window 400. Consequently, the length of filter window 500 (e.g., 36.67 mS) may equal the length of filter windows 300 (e.g., 20 mS) added to the length of filter window 400 (e.g., 16.67 mS). FIG. 5B depicts a frequency response curve 550 that may correspond to filter window 500. Those familiar with the art may appreciate that the two depicted notches in the frequency response curve 550 (e.g., one notch at 50 Hz, one notch at 60 Hz) may, for example, correspond to the reciprocal of the lengths (e.g., 1/16.67 mS, 1/20 mS) of the two rectangular filter windows (e.g., 300 and 400) that may be convolved to create filter window 500.

Figure 6A:
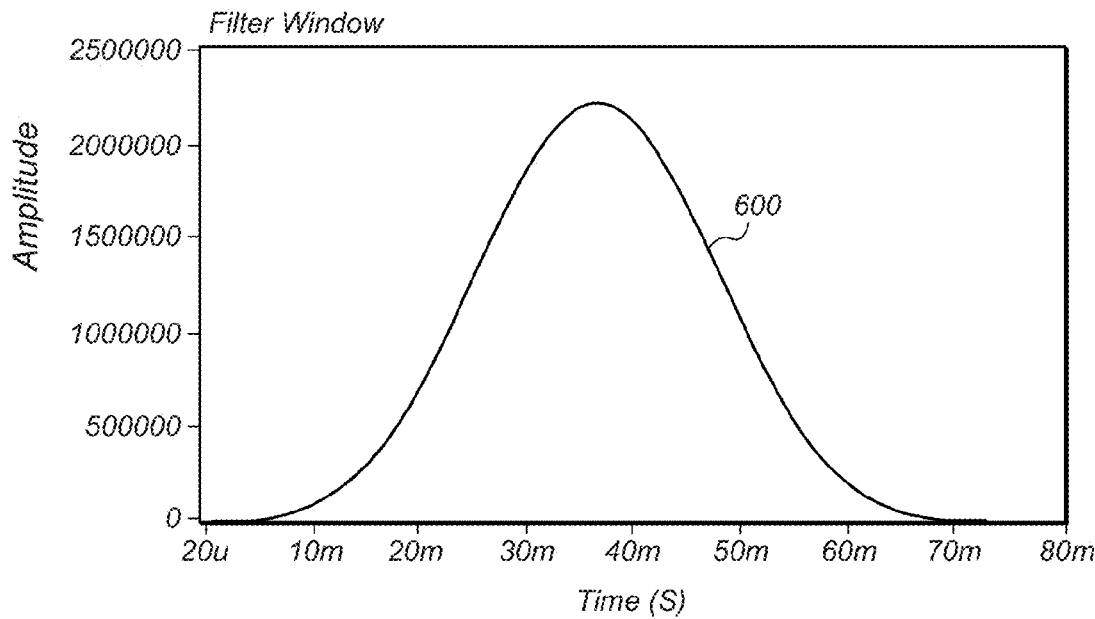
FIGS. 6A and 6B are charts, respectively showing a time domain representation and a frequency response curve for a fourth order convolution of two 20 mS unit rectangular filter windows and two 16.6 mS unit rectangular filter windows.
Figure 6B:
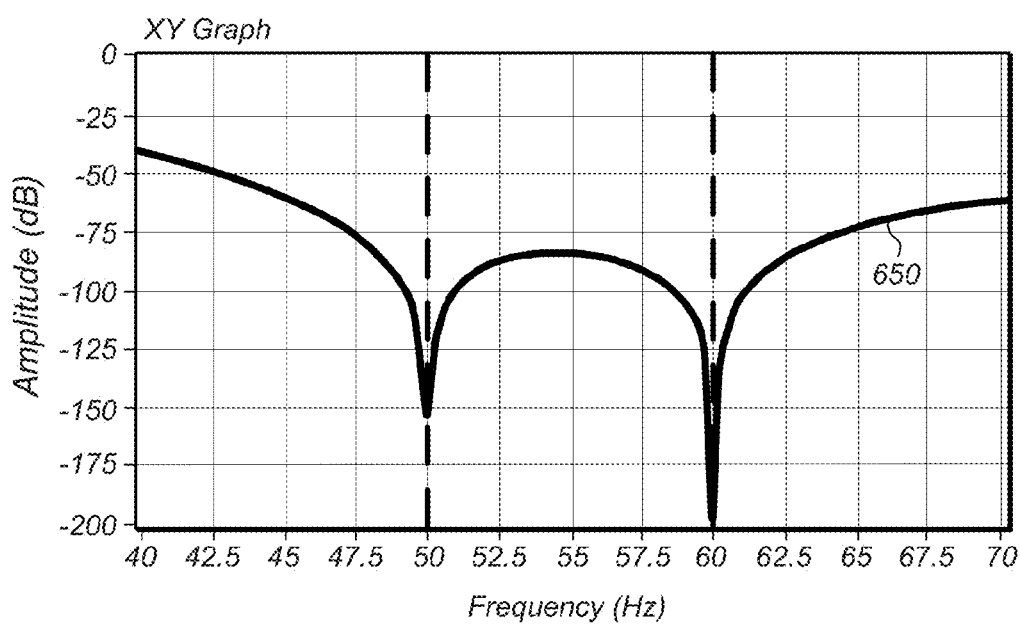

FIG. 6A depicts a time domain representation of a filter window 600 of length 73.33 mS (e.g., 600 integer coefficients generated at 8192 samples/s) and maximum amplitude greater than 2000000. Filter window 600 may be produced by convolving four filter windows including two rectangular filter windows 300 and two rectangular filter windows 400. Consequently, the length of filter window 600 (e.g., 73.33 mS) may equal twice the length of filter windows 300 (e.g., 40 mS) added to twice the length of filter window 400 (e.g., 33.33 mS). FIG. 6B depicts a frequency response curve 650 that may correspond to filter window 600. Those familiar with the art may appreciate that the two depicted notches in the frequency response curve 650 (e.g., one notch at 50 Hz, one notch at 60 Hz) may, for example, correspond to the reciprocal of the lengths (e.g., 1/16.67 mS, 1/20 mS) of rectangular filter windows (e.g., 300, 400) that may be convolved to create filter window 600.

Filter window 600 may be considered to correspond to be a fourth order filter (e.g., four rectangular or rectangle) filter windows were convolved to produce filter window 600) and filter window 500 may be considered to correspond to a second order filter. For example, two first order filter windows (e.g., rectangle functions) may be convolved to produce filter window 500. Comparison of frequency response curve 650 with frequency response curve 550 shows the benefits (e.g., increased notch width) associated with using a higher order filter.

On the Fly Generation

The storing of filter windows (e.g., multiple high order filter windows) by conventional methods may prove problematic—particularly in embodiments where storage is costly or limited or inefficient. For example, there may be insufficient storage space, in a Field Programmable Gate Array (FPGA) with no integrated ROM, to store a filter window as a combinatorial function (e.g., as combinational logic) of the discrete time (sample index) and the desired filter selection. For example, filter window 602 depicted in FIG. 6A may consist of more than six hundred numbers, some of which may have values in the region of 2,200,000. Coefficient values of this magnitude may require 21 bits of storage space per coefficient. Storing sizable quantities of coefficients of this magnitude in RAM may lead to various problems. For example, an unacceptable amount of energy may be consumed configuring an FPGA for a new scan (e.g., after power up) using values held in RAM.

According to various embodiments, much less information may be stored and a coefficient generation circuit (e.g., CG 210) may be used to reconstruct filter window coefficients on the fly. Furthermore, the same coefficient generation circuit may be used to generate filter coefficient values corresponding to a variety of filter windows and may be used to produce filter coefficient values for one or more channels being sampled.

In some embodiments, a number of rectangular filter windows (e.g., rectangular filter windows that may be convolved to generate a desired filter window) may be differentiated. The process of differentiation may transform each rectangle into two delta functions (e.g., one of magnitude 1 at time 0, or index 0, and one of magnitude −1 at the end of the rectangle). The differentiated rectangles may then be convolved as many times as desired (e.g., "FO" times, where FO may equal the order of the filter), and the resulting convolved function may be composed of (e.g., consist solely of) a few delta functions (e.g., less than or equal to $2^{FO}$ delta functions) and each one of delta functions may be of limited amplitude (e.g., amplitude less than or equal to $2^{FO-1}$).

Accordingly, in some embodiments, a differentiated version of a desired filter window of order "FO" may be stored (e.g., as numbers of a size less than "FO+1" bits) in a memory (e.g., a memory coupled to CG 210, a ROM, a RAM, a NVROM, a Flash memory). Additionally, a majority of the stored numbers may be equal to zero which may be beneficial for storing (e.g., storage space may be reduced, storage methods may be simplified, more cost effective storage solutions may be enabled). Furthermore, a differentiated filter function may be reconstructed (e.g., generated, produced, calculated) in an efficient manner. For example, in certain embodiments, the function may be reconstructed through a few combinatorial functions (e.g., one for each bit of the numbers to be stored) and each function may have few minimum terms to be implemented. In certain embodiments, a zero count (e.g., a number equal to the number of zeros preceding the delta) may be stored along with the value of each delta. For each zero count and delta stored, a counter may count down from the zero count value while outputting the value zero. When the counter reaches a terminal value (e.g., the counter reaches zero) the output of the function may be the stored delta value. Then, the next zero count value may be loaded into the counter and the counter may output zero while counting down from the zero count and then the function may output the next stored delta value when the counter reaches zero. Alternatively, the zero count may specify the number of zeros succeeding the delta and a similar counting scheme used.

The efficient storage and reconstruction of delta functions on the fly (e.g., as described above, according to the reception of data samples) may be utilized to generate filter window coefficients in various ways. For example, in some embodiments, the desired coefficients function may be reconstructed by integrating (e.g., by accumulating) several times (e.g., as many times as the number of rectangles used to create the filter window, a filter order number of times) the function of deltas. This integration may be performed by using several accumulators arranged in cascade (e.g., corresponding to ACC[1:P] in FIG. 2). The size of the accumulators may be tailored to a maximum value they will hold (e.g., using a priori knowledge) and thus the resources used for the implementation may be reduced.

Figure 7A:
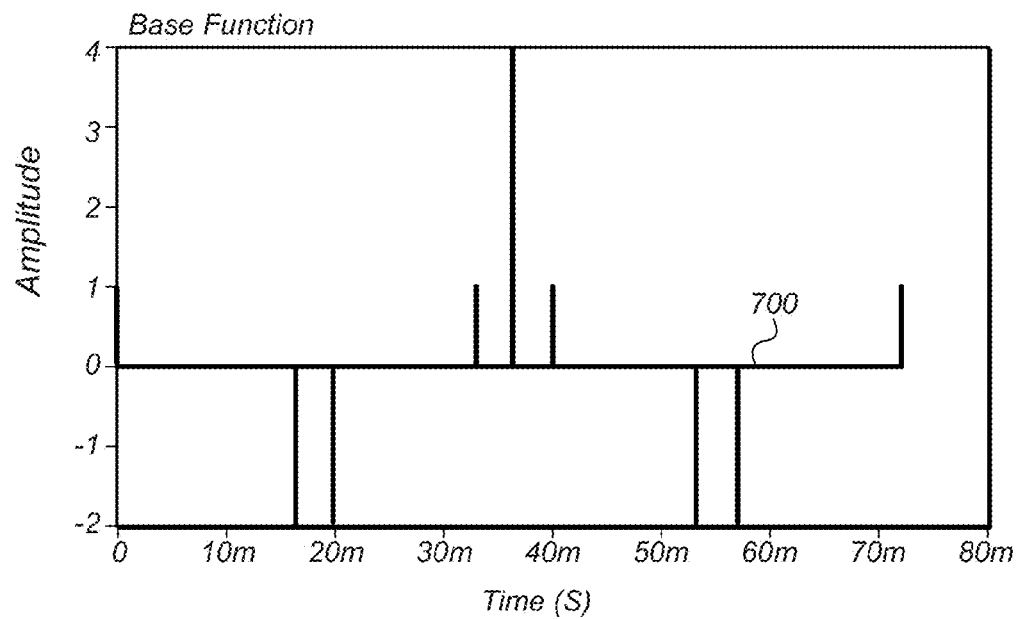
FIG. 7A is a chart showing a time domain representation of a base function corresponding to the convolution of four functions.
Figure 7B:
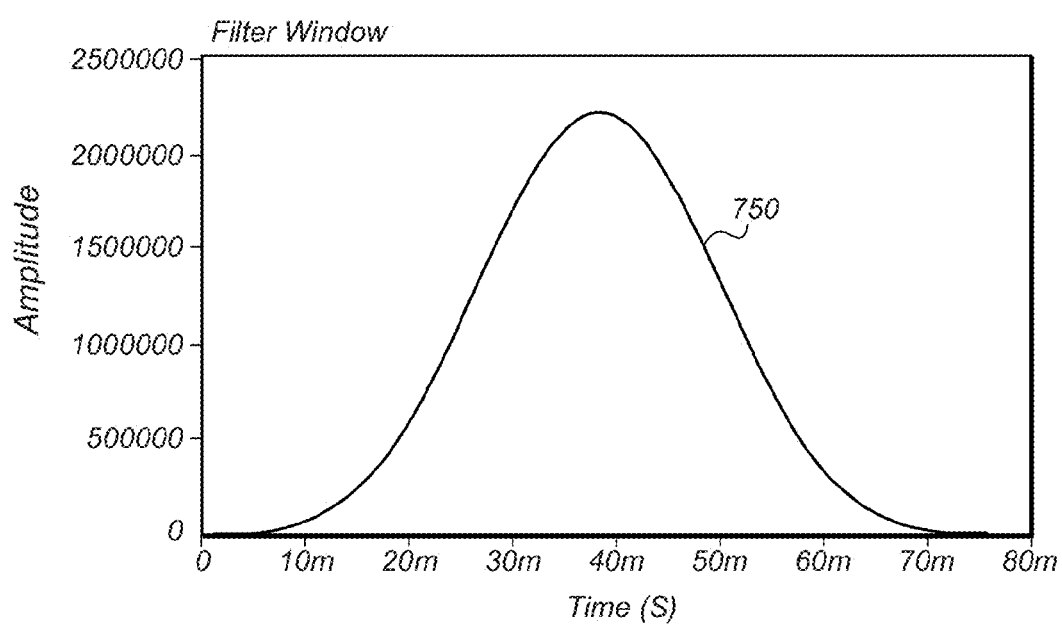
FIG. 7B is a chart showing a time domain representation of function corresponding to a fourth order integration of the base function shown in FIG. 7A.

FIGS. 7A and 7B

In some embodiments, four rectangular filter windows may be convolved to generate a filter function that may, for example, resemble filter function 750 depicted in FIG. 7B. In some embodiments, the same four rectangular filter windows may be differentiated and the differentiated versions of the four rectangular filter windows may convolved (e.g., with each other) to produce a convoluted function. The convoluted function may resemble a function comprising (e.g., consisting of) a plurality of scaled unit delta functions such as, for example, function curve 700 depicted in FIG. 7A.

Multiplication of the Generated Constant

In certain systems (e.g., systems with serial ADCs) multiplying a filter coefficient (e.g., a filter coefficient generated on the fly) by ADC sampled data may be performed by shifting the coefficient value and adding the shifted value to a result accumulator depending if the current bit of ADC serial data being received equates to a binary 1 or a 0. Performing multiplication in this manner may be beneficial in various ways (e.g., in terms of cost and/or implementation complexity and/or power consumption). For example if the ADC (e.g., ADC 114) produces 16-bit data and returns data MSB first (as typically found in serial ADCs), the generated coefficient may be initially shifted 15 bits to the left. Thus the shifted coefficient (e.g., the coefficient multiplied by $2^{15}$) may be added to the accumulator if the received MSB equals one and the accumulator may not be updated if the received MSB equals zero. Furthermore, the coefficient may then be shifted one bit right for the next ADC bit in order to add or not the coefficient multiplied by $2^{14}$ depending on the value of bit MSB-1 of the received ADC serial data.

After all the ADC bits have been shifted in the accumulator, the accumulator may store the values (e.g., current updated values, current accumulated values) given by "ACC" in the following equations. Note that, in the following equations, "ADC[i]" may represent the "ith" bit of the ADC data, "K" may represent the total number of ADC bits (e.g., 8, 16, 24), "ADC[K−1]" may represent the MSB of the ADC data and "ADC[K−1:0]" may represent all the ADC data bits. Note also, that "Coef" may represent the filter coefficient, and ACC' may represent the original (e.g., pre-updated, starting) value of the accumulator.

$$ACC = ACC' + \left[\sum_{i=0}^{i=K-1} ADC[i] * Coef * 2^i\right]$$

This equation may be simplified by factoring the coefficient:—

$$ACC = ACC' + Coef * \left[\sum_{i=0}^{i=K-1} ADC[i] * 2^i\right]$$

By definition of the binary representation of the ADC value this can be further simplified to:—

ACC=ACC'+Coef*ADC[K−1:0]

Thus, a sequence of shifts and additions (e.g., as previously described) may effectively multiply a received ADC data item by a coefficient value and add the results of the multiplication to the contents of an accumulator. In certain embodiments, this may be achieved without using a register to hold the ADC data item value and/or without using a register to hold intermediate multiplication results. In one or more embodiments, a single shifter and single adder may be used and a single register may hold the results that may be returned to the user (e.g., at the end of a scan).

Reutilization of Resources

Various embodiments may provide varying amounts of reuse. For example, in some embodiments, the same accumulator circuitry may be used to perform calculations for different filter windows. In certain embodiments (e.g., in systems supporting multiple channels) once a coefficient value is generated for one channel, that coefficient value and the multiplier circuit may be used for other channels (e.g., all the other channels associated with a data stream). Such reuse may effectively reduce the amount of logic involved in supporting each channel. Also, by rotating (e.g., with every new channel acquired) data through the result registers (e.g., RACC[M−1:0]) that hold the channel results, multiple channels may be supported with less circuitry (e.g., without implementing circuitry to route and/or select data from various channel specific result registers). Rotating (e.g., shifting) results through the result registers may also reduce the amount of additional logic used to hold and track the results of multiple channels.

Different Operating Modes

Some embodiments may be capable of operating in various modes. Support of multiple modes may involve flexibly controlling when to generate a new coefficient value and when to rotate accumulated channel data. Some embodiments may support several sample modes via a channel counter and a sample counter (which may be viewed as a discrete time index). Certain operational behaviors may be common to various operating modes. For example, the following behaviors may be exhibited in more than one operational mode:—a new filter coefficient may be generated when the sample counter changes; the channel result accumulators may be rotated when the channel counter changes; the multiply and add circuit may calculate a new value when a new ADC sample is received; and a base function (function of deltas) may be generated in terms of the sample counter value. For example, if a base function is generated by counting the number of zeros between deltas then the zero counter may increment when the sample counter increments.

Some embodiments may support operation in "interleaved mode". In interleaved mode, the supported channels may be processed in a sequence. Each new ADC sample received may correspond to a next channel (e.g., in an ordered set of channels, in a sequence of channels) and, after an ADC sample for the last channel (e.g., a last channel in the ordered set of channels) has been received, the sequence may start over with the first channel. In certain embodiments, in interleaved mode, the channel counter may increment on new ADC data and may wrap around after the last channel; the sample counter may increment when the channel counter wraps around.

Some embodiments may support operation in "non-interleaved mode". In non-interleaved mode, all the ADC samples in a first group (e.g., a group of data samples obtained during a single filter window) may correspond to the same channel. Subsequent groups of ADC samples (e.g., subsequent groups comprising the same number of samples) may correspond to a next channel in a sequence of channels, and so on. In certain embodiments, in non-interleaved mode, the sample counter may increment on new ADC data and may starts over at the end of a filter window; the channel counter may increment when the sample channel starts over and the accumulators may be reset also when the sample channel starts over.

Certain embodiments may support operation in a "burst interleaved mode". In burst interleaved mode, more than one sample per channel may be acquired for every discrete point in time (e.g., for every filter coefficient). This may be beneficial (e.g., may increase resolution) in certain embodiments (e.g., in a system with a slow settling channel multiplexer). In certain embodiments, burst interleaved mode may be supported in a similar fashion to interleaved mode using a burst counter. In some embodiments, the burst counter may increment on new ADC data and may reset when a terminal count is reached; the channel counter may increments when the burst counter resets and may wrap around after the last channel; and the sample counter may increment when the channel counter wraps around.

A "phase aligned mode" of operation may also be supported, according to some embodiments. In phase aligned mode, data samples may be received in a similar (e.g., interleaved) order to interleaved mode or to burst interleaved modes. However, in phase aligned mode, a new filter coefficient may be calculated for a new ADC data item (e.g., when the new data item represents a new data channel). Accordingly, successive data samples from different channels may be provided with different coefficients. For example, two consecutive data samples in a data stream, each sample corresponding to a different data channel, may be processed using different coefficients. Phase aligned mode may be supported according to various embodiments. In some embodiments, both the sample counter and the channel counter may increment their values on new ADC data (or on a burst of ADC data). Also, the base function (e.g., the function of deltas) and filter window size may change to take into account the aggregate sample rate instead of the sample rate per channel. In various embodiments, the channel counter and the sample counter may behave in a similar fashion to interleaved mode or burst interleaved mode. However, in phase aligned mode, a new filter coefficient may be generated on a new channel. And, while base function generation may be similar to interleaved mode or burst interleaved mode, in phase aligned mode, a delta value may be passed only to the first accumulator on the first channel of the sample corresponding to that delta; a non-delta value (e.g., a zero) may be passed to the first accumulator on subsequent samples corresponding to different channels.

Comparing SAR ADCs and Delta-Sigma ADCs

Delta-Sigma ADCs (DSAs) may be used in a variety of applications for various purposes. For example, DSAs may commonly be used in low frequency applications (e.g., less than 10 Hz, e.g. to integrate out power line noise). DSAs may also be a good choice for medium bandwidth (20 kHz and below) products since the wide dynamic range of the DSA may mean a programmable gain amplifiers is not required. DSAs may also be used audio and dynamic signal analysis applications [e.g., due to their excellent linearity (which may translate into low distortion) and due to their wide dynamic range]. DSAs may also be used in other application areas (e.g., in thermocouple, digital multi-meter, and industrial measurement products).

Oversampled SAR ADCs (OSAs) may provide various functional benefits over DSAs. For example, OSAs may allow more flexible designs, so that, for example, speed and resolution may be gracefully traded for low power. Also, in DC applications for example, an OSA may be able to acquire multiple channels in the time that a DSA acquires just one channel. In some systems, a single ADC (and possibly amplifier) may simulate (e.g., effectively perform the work of) multiple DSAs running simultaneously. However, for all their benefits, OSAs may not replace DSAs in some application areas (e.g., in audio, in dynamic signal analysis) since today's DSAs are typically more linear than today's OSAs.

One example of a flexible OSA design may be a battery powered wireless sensor node design in which speed and/or resolution may be traded off for lower power (e.g. battery life). In some systems, an oversampled SAR (e.g., 16-bit SAR) may provide better dynamic range than is provided by a non-oversampled SAR. This better dynamic range may mean that a programmable gain amplifier is not required, thus reducing the cost and power of the system. Also, in some systems (e.g., in power-line filtered DC applications) a single multiplexed OSA may produce data at a comparable rate to a similar system which has a DSA per channel. Furthermore, the single multiplexed OSA system may produce data at a greater rate than a similar system which has a multiplexed DSA. In some systems (e.g., where multiple channels are measured simultaneously), historically expensive (e.g., in dollars and in power) amplifier-and-ADC-per-channel designs may be replaced with a single multiplexed OSA design.

FIGS. 8A-8D

FIGS. 8A to 8D may allow noise and filtering characteristics of an exemplary SAR ADC (FIGS. 8A and 8B) to be compared to noise and filtering characteristics of corresponding exemplary Delta-Sigma ADC (FIGS. 8C and 8D) at various oversampling ratios. FIGS. 8A-D illustrate—for frequencies up to half the sample rate of the ADC (e.g., Fs/2)—the impact of changing the oversample ratio and hence the output rate when the sample rate is held constant.

FIG. 8A includes various waveforms relating filter characteristics and noise density (on the vertical axis) to frequency (on the horizontal axis) for an exemplary SAR converter. Curve 802 depicts a first filter response curve (e.g., for a first sinc function) corresponding to a first quantity of samples (e.g., a first output frequency). Curve 804 depicts a second filter response curve (e.g., for a second sinc function) corresponding to a second quantity of samples (e.g., a second lower output frequency), where the second quantity of samples may be greater than the first quantity of samples and the second output frequency may be lower than the first sampling frequency. And, curve 806 depicts a third filter response curve (e.g., for a third sinc function) that corresponds to a third quantity of samples (e.g., a third output frequency), where the third quantity of samples may be greater than the second quantity of samples and the third output frequency may be lower than the second output frequency. Lastly, curve 808 depicts noise density associated with the SAR converter system, which may be seen to be approximately constant, at least up to frequency Fs/2 (e.g., half the sampling frequency).

FIG. 8C illustrates how SAR noise density (e.g., noise density curve 808) may be shaped by filter response (e.g., by filter response curve 802). Curve 810 shows relatively low levels of filtered noise may be found at upper frequency ranges (e.g., at frequencies ranging from roughly Fs/4 to Fs/2) even when, for example, the first sinc function (that may correspond to a low number of samples and a high output frequency) is used.

FIG. 8C depicts various waveforms relating filter characteristics and noise density (on the vertical axis) to frequency (on the horizontal axis) for an exemplary delta-sigma converter. In a similar fashion to FIG. 8A, curve 812 depicts a first filter response curve (e.g., for a first sinc function) corresponding to a first quantity of samples (e.g., a first output frequency). Curve 814 depicts a second filter response curve (e.g., for a second sinc function) corresponding to a second quantity of samples (e.g., a second lower output frequency), where the second quantity of samples may be greater than the first quantity of samples and the second output frequency may be lower than the first output frequency. And, curve 816 depicts a third filter response curve (e.g., for a third sinc function) that corresponds to a third quantity of samples (e.g., a third output frequency), where the third quantity of samples may be greater than the second quantity of samples and the third output frequency may be lower than the second output frequency. Lastly, curve 818 depicts noise density associated with the exemplary delta-sigma converter system where the noise density may be seen to rise significantly at higher frequencies, e.g., from approximately a quarter of the sampling frequency (e.g., Fs/4) to half the sampling frequency (e.g., Fs/2).

FIG. 8D illustrates how delta-sigma noise density (e.g., noise density curve 818) may be shaped by filter response (e.g., by filter response curve 812). Curve 820 shows relatively high levels of filtered noise may be found at higher frequencies (e.g., at frequencies ranging from roughly Fs/4 to Fs/2) when, for example, the first sinc function (that may correspond to a low number of samples and a high output frequency) is used.

A comparison of FIGS. 8B and 8D may indicate that, for similar but small numbers of samples (e.g., for similar over-sampling rates, for similar first quantities of samples) the total aggregate noise may be significantly higher in a delta-sigma system than in a corresponding SAR system.

Taking more samples of data and averaging them may result in a lower output rate and lower noise as output rate and noise may be traded off one for the other. The term oversample ratio may be defined as the ratio of the rate at which an ADC samples data versus the rate at which averaged values are output by the sampling ADC. If samples are acquired at a rate of 200,000 per second and every ten samples are averaged and output at a rate of 20,000 per second, then the oversampling ratio may be said to be ten. As illustrated in FIG. 8A, with an SAR ADC, noise may typically be fairly uniform across its spectrum, so oversampling tradeoffs may be made smoothly and continuously. Delta Sigma ADCs, on the other hand, may typically shape their noise so that most of it may be at higher frequencies, as shown in FIG. 8C. For this reason, high oversample ratios may be used to provide the filtering effect of averaging in order to reject this noise. At low oversample ratios this high frequency noise may be not be rejected sufficiently well.

FIGS. 9A-9D

Figure 9A:
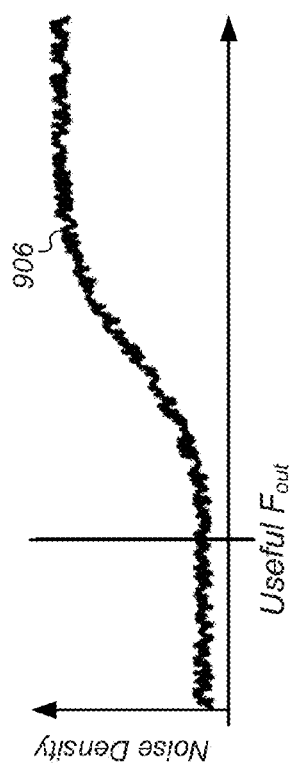
FIG. 9A is a chart illustrating noise density versus frequency for an SAR based system.
Figure 9C:
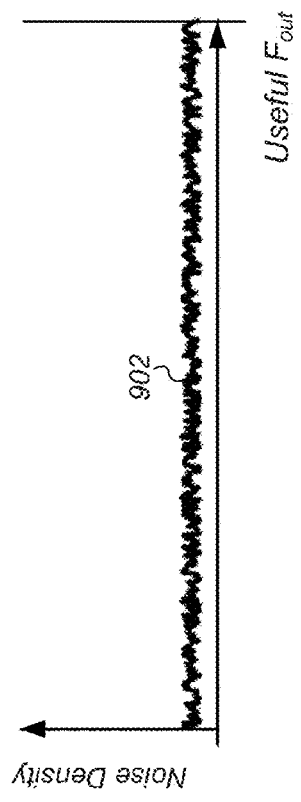
FIG. 9C is a chart illustrating noise density versus frequency for a delta-sigma based system.
Figure 9B:
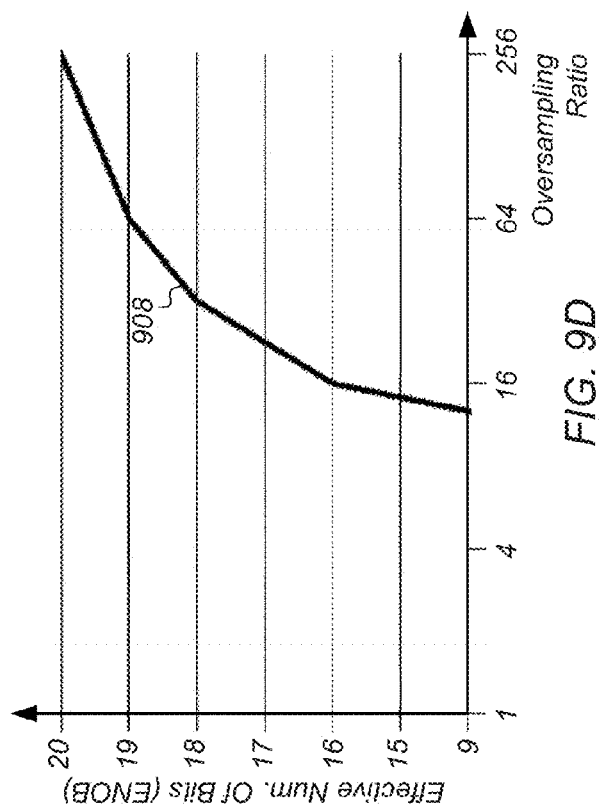
FIG. 9B is a chart illustrating the relationship between sample resolution and oversampling ratio for a SAR based system.
Figure 9D:
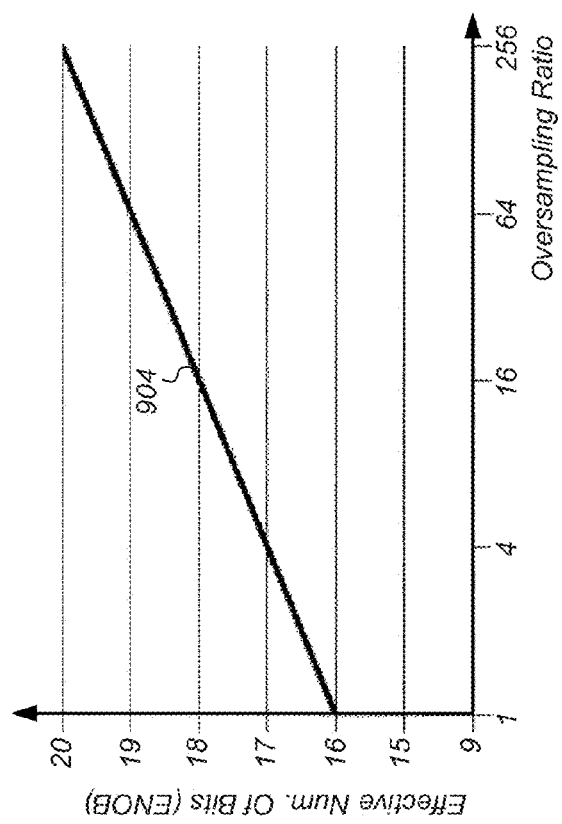
FIG. 9D is a chart illustrating the relationship between sample resolution and oversampling ratio for a delta-sigma based system.

FIGS. 9A to 9D allow a comparison of noise density and sample resolution versus oversampling ratio characteristics of an exemplary SAR ADC (FIGS. 9A and 9B) and an exemplary Delta-Sigma ADC (FIGS. 9C and 9D).

FIG. 9A is a chart showing noise density on the vertical axis and frequency on the horizontal axis. The chart contains a curve 902 of noise density versus frequency for an exemplary SAR converter. As depicted by curve 902 in FIG. 9A, noise density may remain at a fairly uniform level across the frequency spectrum of the chart, indicating a useful range of output frequencies up to the oversampling frequency Fs.

FIG. 9B is a chart showing resolution in the form of Effective Number of Bits (ENOB) on the vertical axis and oversampling ratio on the horizontal axis. The chart features curve 904 which illustrates the relationship between sample resolution (ENOB) and oversampling ratio for an exemplary 16-bit SAR converter. As illustrated by curve 904, the resolution of an SAR ADC may rise linearly with increasing oversampling ratio. According to curve 904, at an oversampling ratio of one, the corresponding ENOB may be 16-bits.

FIG. 9C is a chart showing noise density on the vertical axis and frequency on the horizontal axis. The chart contains curve 906 which illustrates noise density versus frequency for an exemplary Delta-Sigma converter. As illustrated by curve 906, the noise density of a Delta-Sigma converter may remain at a fairly uniform level up to a useful output frequency (e.g., "Useful Fout") after which the noise density may rise non-linearly to a new higher level.

FIG. 9D is a chart showing resolution, in the form of ENOB, on the vertical axis and oversampling ratio on the horizontal axis. The chart features curve 908 which illustrates resolution (ENOB) versus oversampling ratio for an exemplary Delta-Sigma converter. As illustrated by curve 908, the resolution of a Delta-Sigma converter may rise non-linearly with increasing oversampling ratios. According to curve 908, at an oversampling ratio of sixteen bits, the corresponding ENOB is sixteen.

As depicted in FIG. 9B, the ENOB of an oversampled SAR may smoothly (e.g., linearly) increase with an increase in the number of acquired samples (e.g., with an increase in the oversampling ratio). Curve 904 indicates that, for an oversampled SAR, one extra bit of resolution may be obtained for every quadrupling of the oversample ratio. In contrast, a delta-sigma converter may only provide one extra bit of resolution for every quadrupling of the oversample ratio at higher oversampling ratios. As seen in FIG. 9D, at low oversampling ratios (e.g., less than 16×) resolution may fall steeply as the oversampling ratio falls so that, for example, there may be a single bit of resolution at an oversampling ratio of one. This steep fall in resolution may be due to the noise shaping characteristics of Delta-Sigma converters. Since the final output data rate of an ADC may be inversely proportional to its oversampling ratio, a minimum useful oversample ratio (e.g., ×16) may define the maximum useful output rate of a Delta-Sigma converter.

FIGS. 10A-10D

Figure 10C:
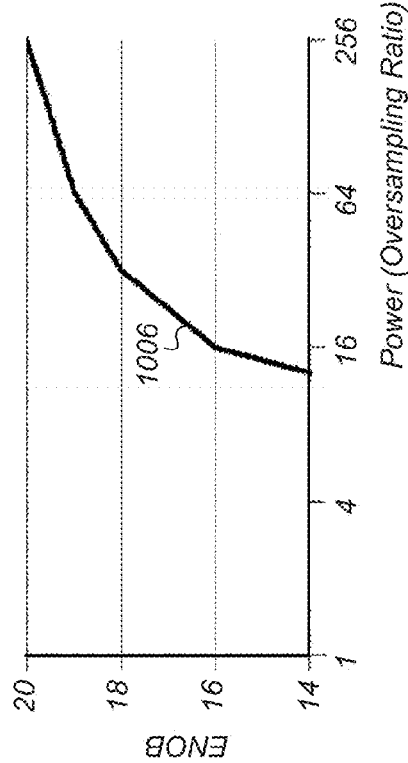
FIGS. 10C and 10D are charts, respectfully illustrating, for a delta-sigma based system, the relationship between sample resolution and power and the relationship between sample resolution and output rate.
Figure 10A:
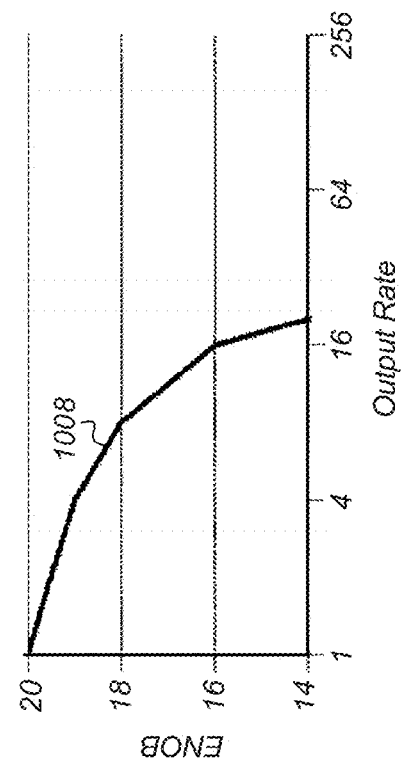
FIGS. 10A and 10B are charts, respectfully illustrating, for a SAR based system, the relationship between sample resolution and power and the relationship between sample resolution and output rate.
Figure 10D:
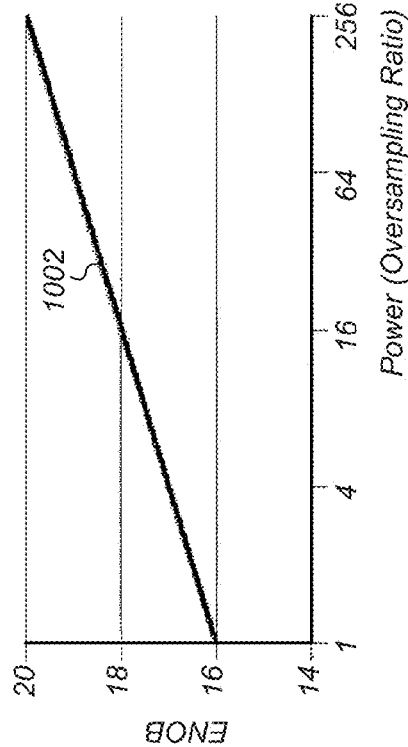

FIGS. 10A to 10D allow a comparison of resolution versus power and resolution versus output data rate for an exemplary oversampled SAR ADC (FIGS. 10A and 10B) and an exemplary Delta-Sigma ADC (FIGS. 10C and 10D). Since taking each data sample may require additional power to be consumed (e.g., by sampling circuitry) the oversampling ratio may be indicative of power consumption. And, for a given sampling frequency, the oversampling rate may be inversely proportional to the output data rate.

FIG. 10A is a chart with resolution (e.g., ENOB) on the vertical axis and power (oversampling ratio) on the horizontal axis. In FIG. 10A, curve 1002 illustrates the relationship between resolution and power for an exemplary oversampled SAR converter at a given output rate. As illustrated by curve 1002, for example, the resolution of a SAR converter may rise linearly as the oversampling ratio (e.g., power) is increased.

Figure 10B:
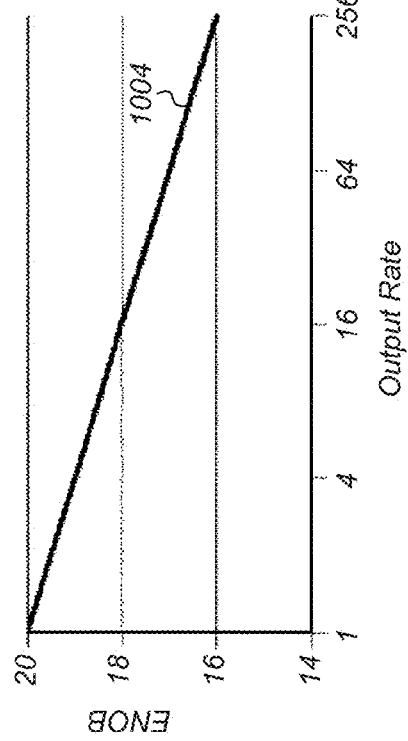

FIG. 10B is a chart with resolution (e.g., ENOB) on the vertical axis and output data rate on the horizontal axis. The output rate may be measured in relative terms so that, for example, 256 may indicate an output rate 256 times an output rate of 1. Curve 1004 depicts the relationship between resolution and output rate for an exemplary oversampled SAR converter being oversampled at a given oversample rate. As illustrated by curve 1004, for example, the resolution of a SAR converter may fall linearly with increasing output rate (e.g., for a fixed sampling frequency).

FIG. 10C is a chart with resolution (ENOB) on the vertical axis and oversampling ratio on the horizontal axis. Curve 1006 illustrates the relationship between resolution and oversampling ratio for an exemplary Delta-Sigma converter at a given output rate. As illustrated by curve 1006, for example, the resolution of a Delta-Sigma converter may rise non-linearly as power consumption (e.g., the oversampling ratio) increases.

FIG. 10D is a chart with resolution (e.g., ENOB) on the vertical axis and output rate on the horizontal axis. Curve 1008 illustrates the relationship between sample resolution and output rate for an exemplary Delta-Sigma converter at a given oversample rate. As depicted by curve 1008, for example, the resolution of a Delta-sigma converter may fall in a non-linear fashion with increasing output rate.

FIGS. 10A and 10C illustrate that, for a given output rate, the oversampling ratio may be adjusted by increasing the sample rate which may increase ADC resolution (but which may also increase converter power). Consequently, converter resolution and power may be traded off for each other. However, the minimum useful oversample ratio of a Delta-Sigma converter may limit the ability to use low power settings. For example, a SAR converter (e.g., the exemplary SAR of FIG. 10A) may operate using a 4× oversampling ratio (e.g. to achieve power savings over a 10× oversampling ratio) while providing 17 bits of resolution. However, a Delta-Sigma converter (e.g., the exemplary SAR converter of FIG. 10C) may only be able to provide 4 bits of resolution while operating in a 4× oversampling mode, which may be insufficient.

FIGS. 10B and 10D illustrate that, for a given sample rate, adjustments to the oversampling ratio may change the output rate but may keep the power constant. Consequently, converter resolution and output rate may be traded off for each other. However, the minimum useful oversample ratio of a Delta-Sigma converter may limit on how fast the output rate can go. For example, the oversampling rate of a SAR converter (e.g., the exemplary SAR converter of FIG. 10B) may be reduced so that the resolution fall from twenty bits to 16 bits, and this may increase the output rate by a factor of 256. However, the steep non-linear fall off in output rate shown in curve 1008 indicates that a Delta-Sigma converter (e.g., the exemplary Delta-Sigma converter of FIG. 10D) may not increase the output rate by such a factor, even with a greater drop in resolution.

FIGS. 11A and 11B

FIGS. 11A and 11B show how sampling (e.g., oversampling) of multiple channels (e.g., four channels) may be performed using a multiplexed Delta-Sigma converter (FIG. 11A) and by using a multiplexed SAR converter (FIG. 11B). For ease of comparison both figures have similar integration period lengths.

In FIG. 11A, four successive integration periods are shown. In each integration period one of the four channels may be sampled by a Delta-Sigma converter. For example, channel zero may be acquired during integration period 1102, channel one may be acquired during integration period 1104, channel two may be acquired during integration period 1106 and channel three may be acquired during integration period 1108. Further integration periods (not depicted) may be used to acquire the same four channels (e.g., in a loop) or acquire additional channels (e.g., also in a loop). Note that each integration period (e.g., 1102, 1104, 1106, 1108 etc.) may involve the taking of multiple samples (e.g. oversampling) by the Delta-Sigma converter in accordance with the typical use of Delta-Sigma converters.

In FIG. 11B, four overlapping integration periods are shown. In each integration period one of the four channels may be sampled by an oversampling multiplexed SAR converter. For example, channel zero may be acquired during integration period 1110, channel one may be acquired during integration period 1112, channel two may be acquired during integration period 1114 and channel three may be acquired during integration period 1116. Note that these integration periods may run concurrently (e.g., significantly overlapping) and that after a sample is taken for a first channel (e.g., channel 1) the next sample may be taken for a second channel (e.g., for channel 2) and so on until after the last channel (e.g., the fourth channel, channel 3) the next sample may be taken again from the first channel (e.g., channel 1).

By interleaving the samples of multiple channels the multiplexed-SAR based design may output multiple channels of power-line filtered data in a single integration period. In contrast, a multiplexed Delta-Sigma converter may only output one channel of filtered data out in an integration period. For example, if an integration period of 20 ms is chosen to provide 50 Hz notches, it may take 80 ms to obtain four channels of data from a multiplexed Delta-Sigma converter, while a multiplexed SAR-based design may output all those channels in 20 ms.

In designs where the amplifiers and sensors may be powered only during the acquisitions, reducing acquisition time may reduce power consumption. Accordingly, a SAR-based design may be used to sample (e.g., obtain, process) a similar quantity of data at lower power, or sample a greater data at similar power, as compared to a Delta-Sigma based design. As illustrated in FIGS. 11A and 11B, for example, a SAR-based design may be able to produce four times more data in a similar time and for similar power as a Delta-Sigma based design (e.g., by repeating the interleaved measurement every 20 ms). Also, the SAR-based design may be able to output a similar quantity of data for less power than a Delta-Sigma based design (e.g., if it powers down for 60 ms after each 20 ms acquisition).

FIGS. 12A and 12B

FIGS. 12A and 12B illustrate two schemes for sampling multiplexed channels.

FIG. 12A depicts four multiplexed channels that may be coupled to a common amplifier, the output of which may feed into a SAR converter. The depicted channels may be channel zero 1202, channel one 1204, channel two 1206 and channel three 1208. These four channels may be multiplexed onto a common output by multiplexer 1210 and the output of multiplexer 1210 may be coupled to the input of amplifier 1212. The output of amplifier 1212 may feed into SAR converter 1214.

Curve 1216 of FIG. 12A illustrates the signal level (e.g., voltage level) at the output of amplifier 1212 over a period of time. Points 1218, 1220, 1222 and 1224 on curve 1216 may indicate the locations of samples taken by SAR converter 1214. Multiplexer 1210 may regularly switch from channel to channel in sequence so that samples of each channel may be taken by SAR converter 1214. When multiplexer 1212 switches to a new channel (e.g., from channel zero to channel one), a new sample period (e.g., 1230, 1232, 1234, 1236) may begin and the output waveform (e.g., 1216) of amplifier 1212 may abruptly change to a new level corresponding to signal on the currently selected channel. After some time (e.g., the settling period on the amplifier), the amplifier output may stabilize and a sample may be taken. Sampling the amplifier output before the output stabilizes may result in less accurate (e.g., noisy) data and so it may be beneficial to wait sufficiently long for the output to stabilize. After a sample is taken, the corresponding sample period may end and the multiplexer may select a new input and a new sample period may begin. Again, the output of the amplifier may change abruptly.

A potential drawback to interleaving measurements by multiplexing into a SAR converter is that the settling time of an amplifier (e.g., the amplifier that drives the SAR converter) may determine the speed at which the SAR converter may sample. For example, to enable high speed sampling a designer may select an amplifier with a correspondingly fast settling time. An amplifier with a fast settling time may be more expensive and consume more power than a similar, but slower, amplifier. One option may be to put an amplifier per channel in front of the multiplexer; this option may cost more than using a single fast amplifier but may provide benefits in terms of power consumption.

Another solution may involve using a single amplifier. However, rather than selecting an amplifier which is sufficiently powerful to settle at the full sampling rate of the ADC, a lower power amplifier is selected. Since multiple readings (e.g., samples) may be averaged, an ADC may be operated in bursts (e.g., burst of samples may be taken). For example, in some multi-channel, multiplexed embodiments, the system may wait sufficiently long (e.g., after selecting a new input channel) for the output of the amplifier (e.g., the amplifier coupled to the multiplexer) to settle and then a burst of samples may be taken at the full rate of the ADC. The multiplexer may then switch to another channel and repeat the process.

FIG. 12B illustrates the burst sampling process according to various embodiments. Curve 1256 depicts the signal level (e.g., voltage level) at the output of a post-multiplexer amplifier (e.g., amplifier 1212) over time. Curve 1256 is of similar shape to curve 1216 thus aiding comparison of the two differing approaches. In some embodiments, a burst of samples may be taken after each change of channel. For example, on curve 1256, a first burst of samples 1258 may be taken for a first channel (e.g., channel zero), a second burst of samples 1260 may be taken for a second channel (e.g., channel one), a third burst of samples 1262 may be taken for a third channel (e.g., channel two) and a fourth burst of samples 1264 may be taken for a fourth channel (e.g., channel three). Comparing curve 1216 (FIG. 12A) and curve 1256 (FIG. 12B), single sample 1218 on curve 1216 may correspond to burst samples 1258 on curve 1256, single sample 1220 on curve 1216 may correspond to burst samples 1260 on curve 1256, single sample 1222 on curve 1216 may correspond to burst samples 1262 on curve 1256, and single sample 1224 on curve 1216 may correspond to burst samples 1264 on curve 1256.

Some multi-channel ADC systems (e.g., ADC systems with a single SAR), may switch channels, wait for the amplifier to settle, take a single sample, and repeat. But, in some situations (e.g. when the amplifier settling time larger than the ADC sampling time) many more samples may be taken per unit time by employing burst sampling (e.g., as described above). In certain embodiments (e.g., in systems that oversample and average SAR readings) acquiring more samples per unit time may provide better performance, and an unusual timing relationship between the samples of burst mode may not be important.

Figure 13A:
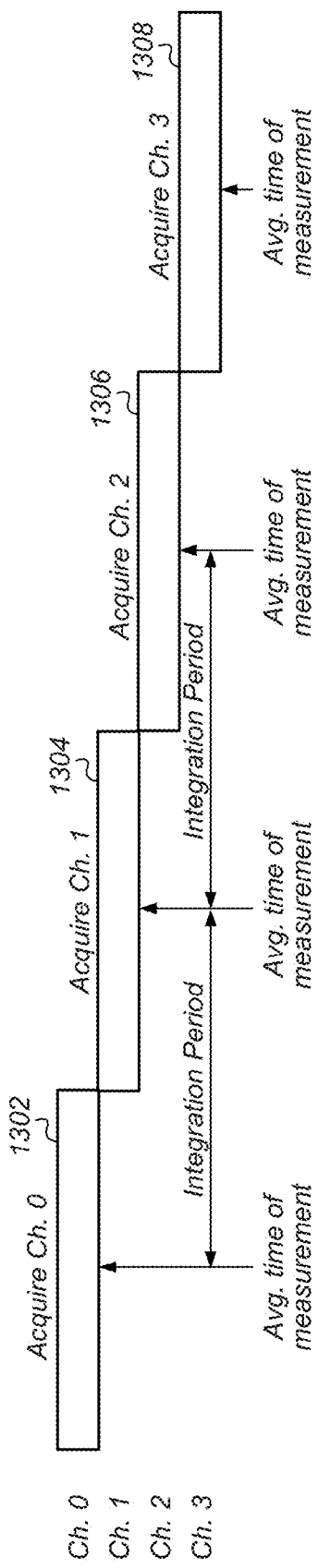
FIG. 13A is a diagram illustrating average measurement times for four groups of samples acquired during four consecutive sampling periods.
Figure 13B:
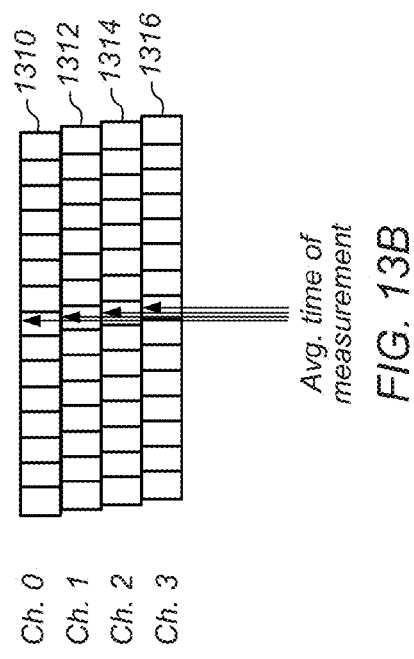
FIG. 13B is a diagram illustrating average measurement times for four groups of samples acquired during four interleaved sampling periods according to an embodiment.

FIGS. 13A and 13B

FIGS. 13A and 13B illustrate the relationship between the average times of successive measurements in a multiplexed multi-channel system. FIG. 13A illustrates the relationship between the average times of successive measurements in a multiplexed, Delta-Sigma system. FIG. 13B illustrates the relationship between the average times of successive measurements in a multiplexed SAR system.

FIG. 13A depicts four successive acquisition periods that may be used to acquire four multiplexed channels in a Delta-Sigma based system. During acquisition period 1302 channel zero data may be sampled, during acquisition period 1304 channel one data may be sampled, during acquisition period 1306 channel two data may be sampled and during acquisition period 1308 channel three data may be sampled. As previously discussed, a Delta-Sigma converter may typically sample multiple times during an integration period (e.g., 16 times, 64 times) and the results of the multiple samples may be averaged. Since the multiple samples may be taken at regular intervals during an acquisition period, the average time of measurement for the samples taken during an acquisition period may be approximately the time at the middle of the acquisition period. As depicted in FIG. 13A, the average time of measurement of successive measurements in a multiplexed Delta-Sigma system may differ by the integration period (e.g., acquisition period). So, for example, for an acquisition period of 32 mS, the average time of measurement for a channel zero (e.g., Ch. 0) measurement may be 32 mS earlier than the average time of measurement for a successive channel one (e.g., Ch. 1) measurement.

FIG. 13B depicts four successive, interleaved acquisition periods that may be used to acquire four multiplexed channels in some embodiments (e.g., some SAR based systems). During acquisition period 1310 channel zero data may be sampled, during acquisition period 1312 channel one data may be sampled, during acquisition period 1314 channel two data may be sampled and during acquisition period 1316 channel three data may be sampled. As depicted in FIG. 13B the acquisition periods may be largely overlapped (e.g., offset by a sampling period), interleaved (e.g., each successive sample is taken from a next channel) and run concurrently (e.g., not in series). As previously discussed, a SAR converter may sample multiple times during an acquisition period (e.g., 16 times, 64 times) and the results of the multiple samples may be combined (e.g., averaged, weighted, computed etc.) Since the multiple samples may be taken at regular intervals during an acquisition period (e.g., during acquisition period 1310 etc.), the average time of measurement for the averaged samples may be approximately the time at the middle of the acquisition period. As depicted in FIG. 13B, since the acquisition periods for the multiple channels may be largely overlapped (e.g., with relatively small offset) the average time of measurement of successive average measurements in a multiplexed SAR system may differ by a relatively small amount (e.g., the sample period of the converter). So, for example, if the acquisition period is 32 mS and sixteen samples are taken during the acquisition period, the average time of measurement for a channel one measurement may be 2 mS earlier than the average time of measurement for a successive channel two measurement.

The interleaved and oversampled SAR approach may obtain a complete set of data samples from all the channels within a single integration period. This may provide the benefit that the averaged data, for each channel sampled, represents the value of that channel's signal at approximately the same time as the other channels. In contrast, a multiplexed delta-sigma approach may results in each channel providing its data after an integration period, so the measurements of the different channels do not represent those channels' values at the same point in time. In some embodiments, the time delay between measurements in an interleaved SAR system may correspond to the time taken by a multiplexer to switch from channel to channel. Since the switching time of a multiplexer may be much smaller than an integration period this may provide a substantial improvement to the inter-channel phase delay of the measurements.

Figure 14A:
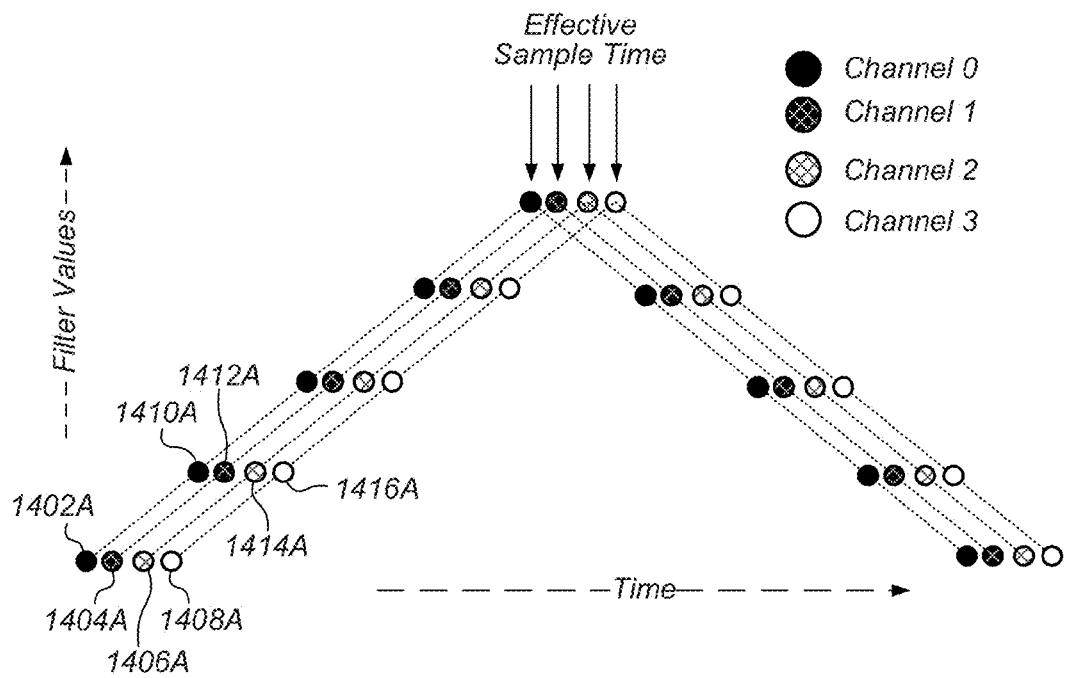
FIG. 14A is a diagram illustrating the application of a weighting function to samples from four channels, where the same weighting function value may be applied to multiple associated samples.
Figure 14B:
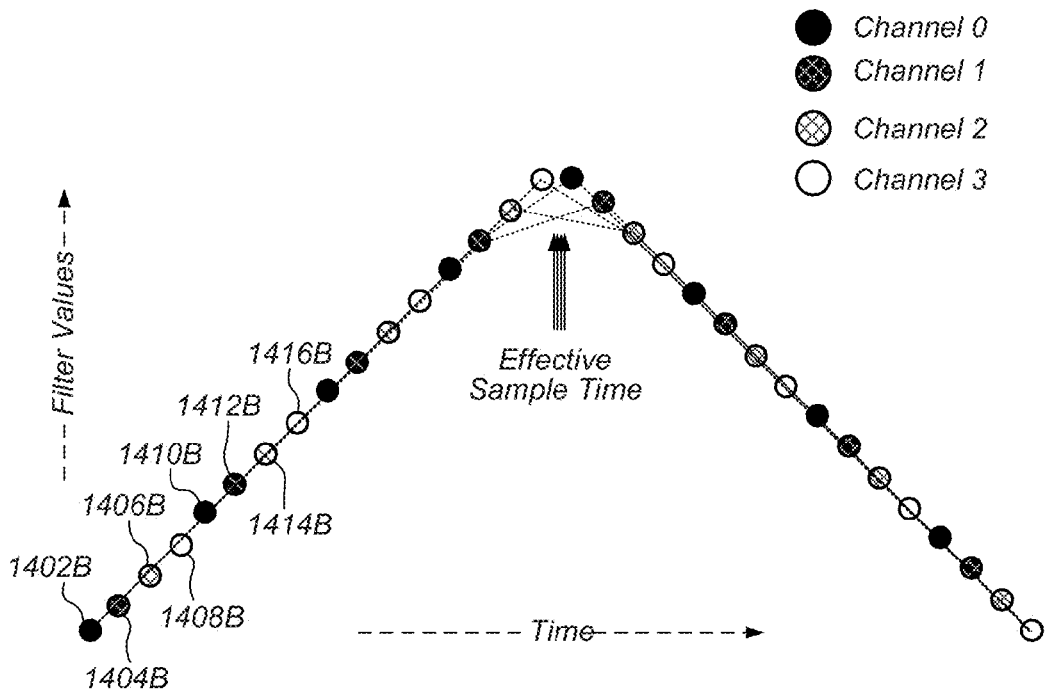
FIG. 14B is a diagram illustrating the application of a weighting function to samples from four channels, where different weighting function values may be applied to multiple associated samples.

FIGS. 14A and 14B

FIGS. 14A and 14B illustrates alternative schemes for applying weighting functions to multiplexed channels. FIG. 14A illustrates a scheme in which, for example, the same weighting function may be applied to all channels. FIG. 14B illustrates an alternative scheme in which the weighting function may be changed after each change in channel FIG. 14A illustrates a scheme in which the same weighting function may be applied to each one of the multiplexed channels. FIG. 14A depicts thirty-six data samples arranged as four sets of nine samples. Each sample is indicated by a circle that is shaded (according to the provided legend) to indicate a corresponding channel. Samples associated with the same channel are connected by dashed lines. On FIG. 14A, time may increase from left to right and filter values may increase from bottom to top. The position of each sample (and the connecting dashed lines) is intended to convey the relative time of the sample and the relative value of the filter coefficient applied to the sample. For example, the first four samples (e.g., of an integration period) may be acquired in the following order, channel 0 sample 1402A, channel 1 sample 1404A, channel 2 sample 1406A and channel 3 sample 1408A. These four samples (e.g., 1402A-1408A) are depicted at a similar height in FIG. 14A to indicate they may be filtered using a similar (e.g., the same), coefficient value. After these four samples are acquired another four samples may be taken. For example, four more samples may be acquired in the following order, channel 0 sample 1410A, channel 1 sample 1412A, channel 2 sample 1414A and channel 3 sample 1414A. These next four samples are also depicted at a similar height in FIG. 14A to indicate that they too may be filtered using a similar (e.g., the same), coefficient value. However, as indicated by their relative vertical positions, the filter coefficient value used for samples 1410-1416 may be larger than the filter coefficient value used for sample 1402-1408. The sampling and filter procedure may continue as described for all thirty six data samples.

Those skilled in the art will appreciate that FIG. 14A may illustrate the sampling of four channels and the application of a similar (e.g., identical) triangular filter window (e.g., weighting function) to each of the channels (e.g., in an interleaved, multiplexed SAR system). Since the weighting function may be the same for all the channels (e.g., channels 0 through 3) and since each sample (e.g., 1404A) may have a temporal offset (e.g., by a multiplexer delay, by a sampling delay, by a amplifier settling time delay, by a combination of small delays) from neighboring samples (e.g., 1402A, 1406A) so the effective sample time of each group (e.g., a single integration period's worth of samples for one channel) may be slightly offset. Thus the data output measurement (e.g., the average measurement after filtering) for each channel may be considered offset from neighboring channels, although perhaps only slightly.

However, the output measurements for the channels may be effectively phase aligned by, for example, the application of an incrementing weighting function. FIG. 14B illustrates a scheme in which an incrementing weighting function may be applied to multiplexed channels. As in FIG. 14A, FIG. 14B depicts thirty-six data samples arranged as four sets of nine samples. Again, in similar fashion to FIG. 14A, each sample is indicated by a circle that is shaded (according to the provided legend) to indicate a corresponding channel. Samples associated with the same channel are connected by dashed lines (which may now substantially overlap). As with FIG. 14A, time may increase from left to right and filter values may increase from bottom to top. The position of each sample (and the connecting dashed lines) is intended to convey the relative time of the sample and the relative value of the filter coefficient applied to the sample. For ease of comparison, samples are numbered similarly to FIG. 14A but, in FIG. 14B, the sample numbers have a "B" postfix. So, in FIG. 14B, the first four samples (e.g., of an integration period) may be acquired in the following order, channel 0 sample 1402B, channel 1 sample 1404B, channel 2 sample 1406B and channel 3 sample 1408B. These four samples (e.g., 1402B-1408B) are depicted with successively increasing heights in FIG. 14B indicating they may be filtered using an incrementally changing coefficient value (e.g., the filter coefficient may change for each sample). After these four samples are acquired another four samples may be taken in a similar fashion. For example, four more samples may be acquired in the following order, channel 0 sample 1410B, channel 1 sample 1412B, channel 2 sample 1414B and channel 3 sample 1414B. These next four samples are also depicted at successively increasing heights indicating that they too may be filtered using an incrementally changing coefficient values. The same ordering of samples and the same relationship between each sample and its respective filter coefficient (e.g., as described for the first eight samples) may apply to all thirty six data samples depicted in FIG. 14B.

FIGS. 14A and 14B allow comparison of two filtering approaches. FIG. 14A illustrates a first scheme in which, for example, a similar (e.g., identical, same) weighting function may be applied to all channels. In this first scheme, the weighting function may be changed after each scan of all channels (e.g., after four samples, after sample 1408A, after sample 1416A). FIG. 14B illustrates a second scheme in which, for example, an incrementally changing weighting function may be applied to each successive sample. In this second scheme, the weighting function may be changed after each change in channel (e.g., after one sample, after samples 1402B, 1404B, 1406B etc). This approach may effectively put all samples (e.g., all samples taken within an integration period, all samples from all channels) on a master filter window which may effectively phase align the samples from each channel. This phase alignment may be accomplished when using different (e.g., $4^{th}$ order, triangle) filter windows for each channel.

An incrementing weighting function scheme (e.g., as illustrated in FIG. 14B) may be used in some embodiments to reduce (e.g., minimize, eliminate, mitigate) even the small residual apparent time delay between output data measurements (e.g., the difference in effective sampling times shown in FIG. 14A). By incrementing through the weighting function values after every channel change, rather than after every scan through the channels, data samples may be weighted as if they were on a master window that has the same effective time of sampling for every channel.

With an incrementing weighting function, each channel may see a slightly different filter window and these filter windows may have a non-symmetric shape. Although the filter windows may be unusual (e.g., be non-symmetric), or may appear unusual, they may be easy to implement and may thus provide a suitable way to remove residual phase delay. However, the incrementing weighting function may involve more filter values and the filter values may be of higher resolution. This may lead to an increase in the number of and size of registers used to hold window filter values. For example, the incrementing weighting function of FIG. 14B may involve four times the number of filter coefficients (and two extra bits of resolution) as the standard weighting function of FIG. 14A. A benefit of using an incremental weighting function may be that measurements may appear to have been taken simultaneously. This is something that previously may have been accomplished by using an ADC and amplifier per channel, which may substantially increase cost.

FIGS. 15A through 15E

Figures 15A, 15B, 15C:
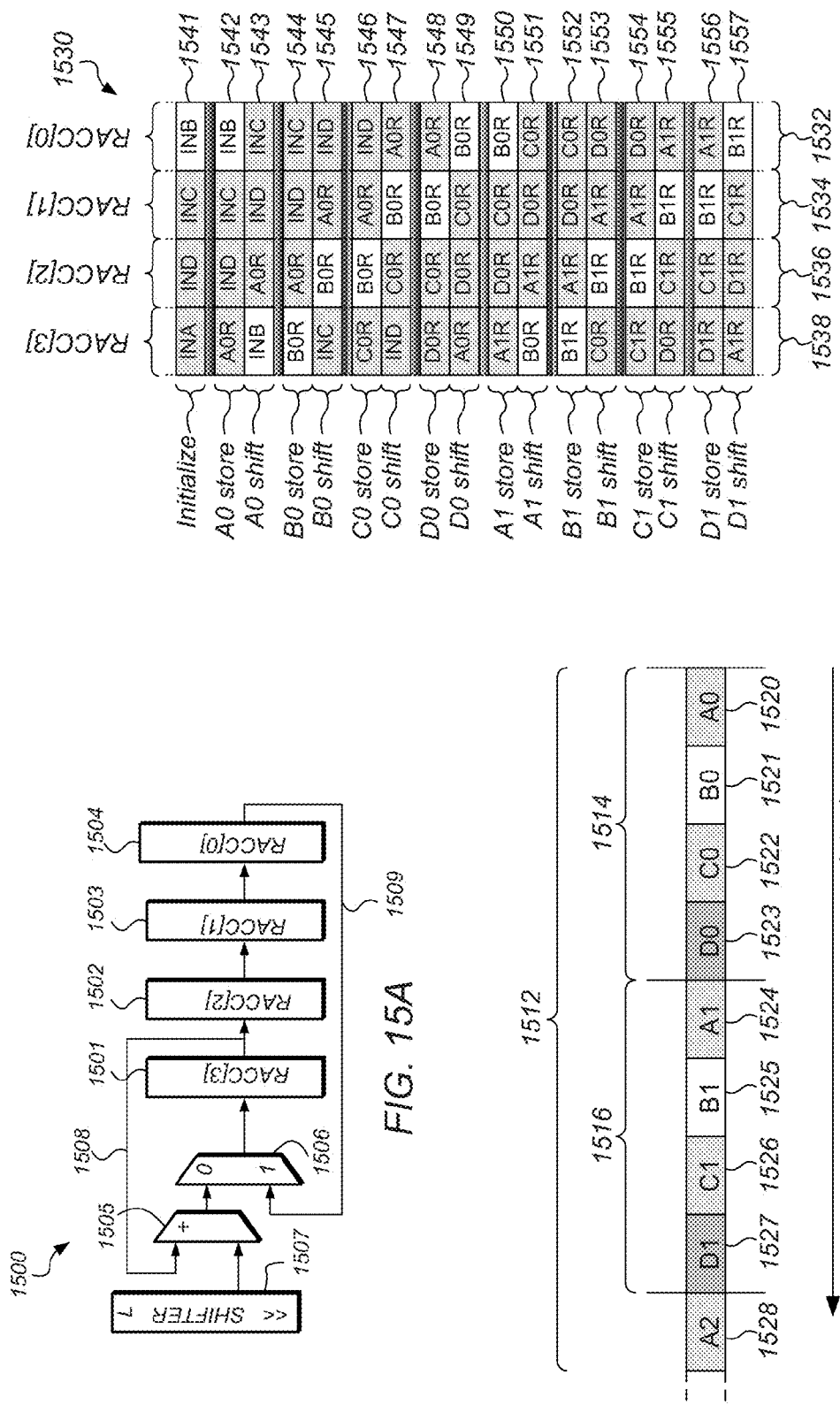
FIGS. 15A, 15B and 15C respectfully depict multiply accumulator circuitry according to a first embodiment, a sequence of data samples, accumulator contents during the processing of the sequence of data samples.

FIGS. 15A through 15E illustrate the operation of multiply accumulator 250 according to various embodiments. FIG. 15A depicts portion 1500 of multiply accumulator 250 circuitry according to one or more embodiments. A comparison of FIG. 15A and the multiply accumulator 250 of FIG. 2 may reveal some differences in the components (and connections between components) but the operation of the two embodiments may be substantially similar. The number of accumulator registers (e.g., "M", RACC[M−1:0]) in portion 1500 may be 4. The depicted portion 1500 may include result accumulator registers RACC[3] 1501, RACC[2] 1502, RACC[1] 1503, RACC[0] 1504, adder 1505, multiplexer 1506 and shifter 1507. In depicted portion 1500, data held in RACC[3] 1501 (e.g., data previously transferred from RACC[0] 1504) may be supplied to adder 1505 via connection 1508. Also, data held in RACC[0] 1504 may be transferred to register RACC[3] 1501 via multiplexer 1506 and connection 1509.

FIG. 15B illustrates a plurality of samples 1512 that may be processed using NRF 112, where NRF 112 may include multiply accumulator 250 and where multiply accumulator 250 may include portion 1500. The plurality of samples 1512 may include a plurality of sample sequences such as, for example, sample sequence 1514 and sample sequence 1516. The plurality of sample sequences may be considered to be a succession (e.g., a sequence, a stream) of sample sequences where, for example, sample sequence 1514 may be considered an earlier sample sequence than sample sequence 1516 and sample sequence 1516 may be considered a later sample sequence than sample sequence 1514. Also, where sample sequence 1516 and sample sequence 1514 are neighboring sample sequences (e.g., there are no sample sequences falling between 1514 and 1516) then sample sequence 1514 may be considered to precede (e.g., immediately precede, precede in the succession of sample sequences 1512) sample sequence 1516 and sample sequence 1516 may be considered to succeed (e.g., immediately succeed, succeed in the succession of sample sequences 1512) sample sequence 1514.

Each sample sequence may include a similar (e.g., the same) number of samples. For example, sample sequence 1514 may include four samples (sample "A0" 1520, sample "B0" 1521, sample "C0" 1522 and sample "D0" 1523) and sample sequence 1516 may also include four samples (sample "A1" 1524, sample "B1" 1525, sample "C1" 1526 and sample "D1" 1527). The plurality of sample sequences may include a large number of sample sequences and the sample sequences may be generated in real time (e.g., generated continuously in real-time, generated regularly for an extended period).

Many (e.g., all, a majority of) sample sequences (e.g., 1516, 1514) in the plurality of sample sequences 1512 may be ordered (e.g., samples may arranged within the sequence) according to a common format. For example, in some embodiments, each sample in a sample sequence may correspond to a channel (e.g., one of the channels connected to analog FE 116). For example, sample "A0" 1520 may belong to a channel designated "A" (e.g., channel 7), sample "B0" 1521 may belong to (e.g. come from) a channel designated "B" (e.g., channel 4), sample "C0" 1522 may belong to a channel designated "C" (e.g., channel 0) and sample "D0" 1523 may belong to a channel designated "D" (e.g., channel 2).

In some embodiments, each sample in a sample sequence may correspond to a different channel in set of channels and the common format may correspond to an ordered set of channels. For example, as depicted in FIG. 15B, a number of sample sequences (e.g., all sample sequences, sample sequences 1514, 1516) may be ordered according to a common format that corresponds to an ordered set of channels (e.g., channel "A" first, channel "B" second, channel "C" third and channel "D" fourth). For example, samples "A0" 1520, "A1" 1524 and "A2" 1528 may respectively represent first, second and third samples from channel "A", samples "B0" 1521 and "B1" 1525 may respectively represent first and second samples from channel "B", samples "C0" 1522 and "C1" 1526 may respectively represent first and second samples from channel "C", and samples "D0" 1523 and "D1" 1527 may respectively represent first and second samples from channel "D".

In some embodiments, samples occupying the same position within respective sample sequence (e.g., sample A0 1520 occupying first position within sample sequence 1514 and sample A1 1524 occupying first position within sample sequence 1516) may form a series (e.g., a sequence, a succession) of samples from common channel (e.g., channel "A"). Furthermore, samples occupying the same position (e.g., "C0" 1522, "C1" 1526) within successive sample sequences (e.g., samples sequences 1514 and 1516) may be successive samples from a channel (e.g., successive samples from channel "C"). The samples depicted in FIG. 15B are shaded and named (e.g., by the first letter of the sample name) to indicate, for each respective sample, a corresponding channel. For example, samples from channel "A" are cross-shaded and are named "A$" where "$" may represent a relative position within a series of samples from channel "A"; samples from channel "B" are shaded white and are named "B$" where "5" may represent a relative position within a series of samples from channel "B"; samples from channel "C" are diagonally shaded and are named "C$" where "$" may represent a relative position within a series of samples from channel "C"; and finally, samples from channel "D" are shaded solid grey and are named "D$" where "$" may represent a relative position within a series of samples from channel "D".

FIG. 15C depicts a table 1530 that illustrates the changing contents of accumulator registers (e.g., RACC[3:0] of FIG. 15A) and the movement of data between accumulator registers (e.g., between registers RACC[3] 1501, RACC[2] 1502, RACC[1] 1503 and RACC[0] 1504) during the processing of the plurality of data samples 1512 according to various embodiments (e.g., embodiments that may correspond to portion 1500).

Cells in table 1530 are shaded according to the contents of the individual cell. Cells are shaded in a similar fashion to the plurality of samples 1512. For example, cells that may be associated with channel "A" or that may be associated with a sample corresponding to channel "A" (e.g., sample "A0" 1520 or sample "A1" 1524) are cross-hatch shaded. Also, cells that may be associated with channel "C" or that may be associated with a sample corresponding to channel "C" (e.g., sample "C0" 1522 or sample "C1" 1526) are diagonally shaded.

Table 1530 has four columns (e.g., 1532, 1534, 1536 and 1538) where each column may display the contents of a respective accumulator register. So, in table 1530, column 1538 may display the contents of the RACC[3] register 1501, column 1536 may display the contents of the RACC [2] register 1502, column 1534 may display the contents of the RACC[1] register 1503 and column 1532 may display the contents of the contents of the RACC[0] register 1504. Table 1530 is also organized by rows and each row may display the contents of the four RACC registers at successive points during the processing of samples 1512. The top row 1541 of table 1530 may depict RACC[3:0] register contents prior to processing sample sequence 1514 and the bottom row 1557 may depict RACC[3:0] register contents subsequent to processing sample sequence 1516.

In table 1530, top row 1541 may depict RACC[3:0] contents after initialization values have been stored in registers. Initialization values may be stored in each register to correspond to a channel. For example, an initialization value "INA" corresponding to channel "A" may be stored in RACC[3] register 1501 and an initialization value "IND" corresponding to channel "D" may be stored in RACC[2] register 1502 and similarly for initialization values "INC" and "INB". The initialization values "INA", "INB", "INC" and "IND" may be various values (e.g., may be the same value, may be zero, may correspond to previous samples etc.) The remaining rows in table 1530 may be partitioned into groups of two rows (e.g., rows 1542 and 1543, rows 1544 and 1545), and each group of two rows may correspond to a sample of the plurality of samples 1512.

The top row of each group of two rows may depict accumulator register contents after a sample has been processed and a corresponding result has been stored. For example, row 1542 "A0 store" may depict the contents of accumulator registers RACC[3:0] after sample "A0" 1520 has been processed and corresponding result "A0R" has been stored. Similarly, row 1554 "C1 store" may depict the contents of accumulator registers RACC[3:0] after sample "C1" has been processed and corresponding result "C1R" has been stored. In table 1530, the result of processing a sample "X#" (where X may be "A", "B", "C" or "D" and "#" may be "0", "1") of the plurality of samples 1512, may be designated "X#R".

The bottom row of each group of two rows may depict accumulator register contents after the contents of accumulator registers RACC[3:0] have been shifted. For example, row 1543 "A0 shift" may depict the contents of accumulator registers RACC[3:0] after the register contents shown in row 1542 "A0 store" have been shifted. Similarly, row 1555 "C1 shift" may depict the contents of accumulator registers RACC[3:0] after the register contents shown in row 1554 "C1 store" have been shifted. As depicted in FIG. 15C, in some embodiments, after each successive sample in each sample sequence is processed, the contents of the result accumulator registers may be shifted.

In some embodiments, (e.g., as depicted in FIGS. 15A, 15B and 15C), the number of accumulator registers (e.g., RACC[3:0]) may match the number of samples in a sample sequence, e.g., 4), the contents of the accumulator registers (e.g., RACC[3:0]) may be shifted once per result store operation (e.g., after each result store operation, before each store operation), the result accumulators may be coupled in series (e.g., in sequence) and an output of the trailing (e.g., last in series) accumulator register (e.g., RACC[0]) may be coupled to an input of the leading (e.g., first in series) accumulator register (e.g., RACC[3]) so that result data within the accumulator registers (e.g., results "A0R", "B0R" etc.) may be rotated through the accumulator registers. In some embodiments, the contents of the result accumulator registers may be rotated in sequence with the order of samples in sample sequences being processed (e.g., sample sequence 1514, 1516) in such a way that, for each sample being processed, result data corresponding to a preceding sample (or preceding samples) from the same channel may be stored in the first accumulator register (e.g., RACC[3], the accumulator register coupled, e.g., via 1508, to adder 1505. This may allow, for example, results for the current sample to be combined (e.g., accumulated) with one or more previous results (e.g., previous results from the same channel).

Shifting (e.g. rotating) the contents of accumulator registers RACC[3:0] in sequence with the successive processing of samples from the plurality of samples 1512 may be observed in FIG. 15C. As shown in the row 1541, RACC[3] 1501 may hold "INA" (e.g., an initialization value for channel "A"). The value "INA" may be added (e.g., in adder 1505) to another value (e.g., a value calculated for sample "A0" 1520) to produce a resulting accumulated value (e.g., "A0R") that may be stored in RACC[3] 1501 (as depicted in row 1542), overwriting value "INA". After the store operation of row 1542, result data may be rotated through RACC[3:0] so that, for example, RACC[3] 1501 may now hold the value "INB" as depicted in row 1543.

The value "INB" (e.g. an initialization value for channel B) held in RACC[3] 1501 may be supplied (e.g., to adder 1505 via connection 1508) to produce, for example, an accumulated value "B0R" for sample "B0" 1521. And, as depicted in row 1544, accumulated value "B0R" may be stored into RACC[3] 1501 overwriting "INB". Then, the contents of each register in the sequence of result accumulator registers may be shifted to the next successive register in the sequence, as depicted in tow 1545 for example.

A resulting value "C0R" corresponding to sample "C0" 1522 may be similarly generated and stored (e.g., as illustrated in row 1546), followed by a rotation of stored data (e.g., as illustrated in row 1547). Similarly, for sample "D0" 1523, a resulting value "D0R" may be generated and stored (e.g., as illustrated in row 1548), followed by a rotation of stored data (e.g., as illustrated in row 1549). By row 1549, all the initialization data (e.g., channel initialization data "INA, IND, INC, INB") stored in the accumulator registers RACC[3:0] may be overwritten with resulting data (e.g., "A0R, D0R, C0R, B0R") corresponding to samples from sample sequence 1514.

After sample D0 has been processed, and resulting data shifted (e.g. row 1549) the first sample of next sample sequence (e.g., sample "A1" 1524) may be processed. As shown in row 1549, RACC[3] 1501 may hold the value "A0R" the value resulting from processing sample A0 1520. The value "A0R" may be added (e.g., in adder 1505) to a value calculated for sample "A1" 1524 to produce a resulting accumulated value (e.g., "A1R") that may be stored in RACC[3] 1501 (as depicted in row 1550), overwriting value "A0R". After the store operation of row 1550, result data may be rotated through RACC[3:0] so that, for example, RACC[3] 1501 may now hold the value "B0R" as depicted in row 1551. The value "B0R" (e.g., the value resulting from the processing of sample "B0") held in RACC[3] 1501 may be supplied (e.g., to adder 1505 via connection 1508) to produce, for example, an accumulated value "B1R" for sample "B1" 1525, and accumulated value "B1R" may be stored (e.g., as depicted in row 1552) into RACC[3] 1501 overwriting "B0R". After the store operation of row 1552, result data may be rotated through RACC[3:0] so that, for example, RACC[3] 1501 may now hold the value "C0R" as depicted in row 1553. A resulting value "C1R" corresponding to sample "C1" 1526 may be similarly generated and stored (e.g., as illustrated in row 1554), followed by a rotation of stored data (e.g., as illustrated in row 1555). Similarly, for sample "D1" 1527, a resulting value "D1R" may be generated and stored (e.g., as illustrated in row 1556), followed by a rotation of stored data (e.g., as illustrated in row 1557). By row 1557, all the resulting data corresponding to sample sequence 1514 (e.g., resulting data "A0R, D0R, C0R, B0R") held in the accumulator registers RACC[3:0] may be overwritten with resulting data (e.g., "A1R, D1R, C1R, B1R") corresponding to samples from sample sequence 1516. In such a manner, for each channel of a plurality of channels, results corresponding to successive samples from the channel may be accumulated together.

In one sense, coefficient generator 210 and multiply accumulator (MAC) 250 operate together to multiply a coefficient with a serial ADC sample on the fly. In other words, the ADC sample bits may be used as they are received serially, without a need for storing or holding those bits, to enable/disable an accumulator register that may add to itself the value of a shifted constant. This may effectively implement a multiply-and-add operation by the time all the ADC sample bits have been received, and may therefore save the cost of holding the intermediate value of the ADC sample and the intermediate value of the product of the ADC value and the filter coefficient. As shown in FIG. 2, MAC circuitry 250 may be designed for multiple channels by having various registers connected in a circular arrangement (one embodiment for 4 channels is shown in FIG. 15A). The first register may operate to calculate a new intermediate value (a current effective sample) for a given channel, and all the values in the sequence of registers may be rotated to have the first register hold the accumulated value for the next channel in order to calculate the new intermediate value for that other channel, and so on for all the channels. This may be performed as many times as the number of samples to be processed. By performing the operation in this manner—in contrast to using each channel register to provide data to the MAC circuitry and store the result of the MAC circuitry for that channel—there may be no need for a M×N-to-N multiplexer, where M is the number of channels and N is the number of bits of the accumulator, with N×M referring to the product of M and N, i.e."M times N", and to select which register is coupled to the MAC circuitry at any given time. Instead, Shifter 254 and Adder 260—referring again to FIG. 2—together with any associated control signals designed to enable and synchronize the operation of Shifter 254 and Adder 260, may be used to perform a sequence of additions that involve all the registers or accumulators (e.g. RACC[M−1] to RACC[0]), by introducing multiplexer 262, which may be a 2×N-to-N multiplexer instead of a M×N-to-N multiplexer. As mentioned above, FIG. 15A shows one embodiment where the number of channels (the number of registers, M) equals 4.

FIG. 15D depicts an alternative embodiment 1560 of a portion of multiply accumulator 250 circuitry. As depicted, the number of accumulator registers (e.g., "M", RACC[M−1:0]) in embodiment 1560 may be 5. A comparison of FIG. 15D and the multiply accumulator 250 of FIG. 2 may reveal some differences in the components (and connections between components) but the two embodiments may be operated in a similar fashion. The depicted embodiment 1560 may include shifter 1566, adder 1567, multiplexer 1568 and result accumulators RACC[0] 1561, RACC[3] 1562, RACC[0] 1563, RACC[1] 1564, RACC[0] 1565. In depicted portion 1560, data held in RACC[0] 1565 may be transferred to adder 1567 via multiplexer 1568 and connection 1569. Also, data held in RACC[0] 1561 (e.g., data previously stored in RACC[0] 1561, for example, by adder 1567) may be supplied to adder 1567 via connection 1570. Note that in depicted embodiment 1560, RACC[0] 1565 may provide data to adder 1567 via connection 1569 whereas in depicted portion 1500 (in FIG. 15A) RACC[3] 1501 may provide data to adder 1505 via connection 1508.

It should be noted with respect to the operation of embodiment 1560, that when the value read from ADC(s) 114 is zero (i.e. all bits are '0'), the result of the MAC operation may store the same previous value for that channel, stored in RACC[0] 1565, into accumulator register RACC[4] 1561 before the new MAC operation begins. This may be accomplished through multiplexer 1568 and adder 1567, which may, however, result in also adding whatever value is present in shifter 1566 (the current filter coefficient). Thus, in some embodiments, additional control logic may be added to gate off the value of the shifter or to bypass the adder in such cases. It should also be noted that for the sake of clarity and simplicity, specific control signals that may be used in processing samples and rotating results, and specific control signals that may be used in implementing the MAC operation on the accumulator registers—which may be a part of the rotating registers themselves—have been omitted from FIGS. 15A and 15D.

More specific to embodiment 1560, a control signal may be provided to multiplexer 1568 to select the data input coming to multiplexer 1568 from RACC[0] 1565 on the first bit from the ADC that equals one. This first addition may recover the stored value for the channel from RACC[0] 1565 and store the intermediate result in RACC[4] 1561. However, subsequent additions (one addition for each bit from the ADC that equals one) may use the intermediate value from RACC[4] 1561 in order to complete the MAC operation. In other words, the control signal may select the data input coming to multiplexer 1568 from RACC[4] 1561 in these cases. This sequence of additions (as many as there are ones on the ADC value) may be considered a Store operation, which may be alternated with a shift operation. It should also be noted that this control signal may not cover the case when the ADC value has no ones (the case referenced above), in which case the Store operation may be performed without affecting the value of RACC[0] 1565, which is to be transferred to RACC[4] 1561.

FIG. 15E depicts a table 1580 that illustrates the changing contents of accumulator registers (e.g., RACC[4:0] of FIG. 15D) and the movement of data between accumulator registers (e.g., between registers RACC[4] 1561, RACC[3] 1562, RACC[2] 1563, RACC[1] 1564 and RACC[0] 1565) during the processing of the plurality of data samples 1512 according to various embodiments (e.g., embodiments that may correspond to depicted embodiment 1560).

Cells in table 1580 are shaded according to the contents of the individual cell. Cells are shaded in a similar fashion to the plurality of samples 1512. For example, cells that may be associated with channel "A" or that may be associated with a sample corresponding to channel "A" (e.g., sample "A0" 1520 or sample "A1" 1524) are cross-hatch shaded. Also, cells that may be associated with channel "C" or that may be associated with a sample corresponding to channel "C" (e.g., sample "C0" 1522 or sample "C1" 1526) are diagonally shaded.

Table 1580 has five columns, where each column may display the contents of a respective accumulator register. In table 1580, column 1575 may display the contents of the RACC[4] register 1561, column 1574 may display the contents of the RACC[3] register 1562, column 1573 may display the contents of the RACC[2] register 1563, column 1572 may display the contents of the RACC[1] register 1564 and column 1571 may display the contents of the contents of the RACC[0] register 1565. Table 1580 is also organized by rows and each row may display the contents of the five RACC registers at successive points during the processing of samples 1512. The top row 1581 of table 1580 may, for example, depict RACC[4:0] register contents prior to processing sample sequence 1514 and the bottom row 1597 may depict RACC[4:0] register contents subsequent to processing sample sequence 1516.

In table 1580, top row 1581 may depict RACC[4:0] contents after initialization values have been stored in registers, initialization values may be stored in each register to correspond to a channel. For example, an initialization value "INA" corresponding to channel "A" may be stored in RACC[0] register 1565 (and also in RACC[4] register 1561) and an initialization value "IND" corresponding to channel "D" may be stored in RACC[3] register 1562 and similarly for initialization values "INC" and "INB". The initialization values "INA", "INB", "INC" and "IND" may be various values (e.g., they may be the same value, they may be zero, they may correspond to previous samples etc.) The remaining rows in table 1580 may be partitioned into groups of two rows (e.g., rows 1586 and 1587, rows 1594 and 1595), and each group of two rows may correspond to a sample of the plurality of samples 1512.

The top row of each group of two rows may depict accumulator register contents after a sample has been processed and a corresponding result has been stored. For example, row 1582 "A0 store" may depict the contents of accumulator registers RACC[4:0] after sample "A0" 1520 has been processed and result "A0R" has been stored. Similarly, row 1594 "C1 store" may depict the contents of accumulator registers RACC[4:0] after sample "C1" has been processed and a result "C1R" has been stored. In table 1580, the result of processing a sample "X#" (where X may be "A", "B", "C" or "D" and "#" may be "0", "1") of the plurality of samples 1512, may be designated "X#R".

The bottom row of each group of two rows may depict accumulator register contents after the contents of accumulator registers RACC[4:0] have been shifted. For example, row 1583 "A0 shift" may depict the contents of accumulator registers RACC[4:0] after the register contents shown in row 1582 "A0 store" have been shifted. Similarly, row 1595 "C1 shift" may depict the contents of accumulator registers RACC[4:0] after the register contents shown in row 1594 "C1 store" have been shifted. As depicted in FIG. 15E, in some embodiments, after each successive sample in each sample sequence is processed (e.g., stored), the contents of the result accumulator registers may be shifted.

In some embodiments, (e.g., as depicted in FIGS. 15B, 15D and 15E), the number of accumulator registers (e.g., RACC[4:0], 5 registers) may exceed (e.g., by one) the number of samples in a sample sequence (e.g., 4), the contents of the accumulator registers (e.g., RACC[4:0]) may be shifted once per result store operation (e.g., after each result store operation, before each store operation), the result accumulators may be coupled in series (e.g., in sequence) and an output of the trailing (e.g., last in series) accumulator register (e.g., RACC[0]] may be coupled to an input of the adder 1567 so that shifted result data may be accumulated, e.g., with new result data, with new result data corresponding to the same channel). In some embodiments, the contents of the result accumulator registers may be shifted in sequence with the order of samples in sample sequences being processed (e.g., sample sequence 1514, 1516) in such a way that, for each sample being processed, result data corresponding to one or more preceding samples from the same channel is output from the last accumulator register, e.g., RACC[0] 1565 to adder 1567 via connection 1569 and multiplexer 1568. This may allow, for example, results for the current sample to be accumulated with one or more previous results (e.g., previous results from the same channel).

Shifting the contents of accumulator registers RACC[4:0] in sequence with the successive processing of samples from the plurality of samples 1512 may be observed in FIG. 15E. As shown in the row 1581, RACC[0] 1565 may hold "INA" (e.g., an initialization value for channel "A"). The value "INA" may be added (e.g., in adder 1567) to another value (e.g., a value calculated for sample "A0" 1520) to produce a resulting accumulated value (e.g., "A0R") that may be stored in RACC[4] 1561 (as depicted in row 1582), overwriting previous value "INA". After the store operation of row 1582, result data may be shifted through RACC[4:0] so that, for example, RACC[0] 1565 may now hold the value "INB" as depicted in row 1583. The value "INB" (e.g. an initialization value for channel B) held in RACC[0] 1565 may be supplied (e.g., to adder 1567 via connection 1569) to produce, for example, an accumulated value "B0R" for sample "B0" 1521, and accumulated value "B0R" may be stored into RACC[4] 1561 overwriting "A0R", as depicted in row 1584. Then the contents of the sequence of result accumulator registers may be shifted, and after the shifting the contents of RACC[4:0] may resemble row 1585. A resulting value "C0R" corresponding to sample "C0" 1522 may be similarly generated and stored (e.g., as illustrated in row 1586), followed by a shift of accumulated data (e.g., as illustrated in row 1587). Similarly, for sample "D0" 1523, a resulting value "D0R" may be generated and stored (e.g., as illustrated in row 1588), followed by a shifting of stored data (e.g., as illustrated in row 1589). By row 1589, all the initialization data (e.g., channel initialization data "IND, INC, INB, INA") held in the accumulator registers RACC [3:0] may be overwritten with resulting data (e.g., "D0R, C0R, B0R, A0R") corresponding to samples from sample sequence 1514.

After sample D0 has been processed, and resulting data shifted (e.g. row 1589) the first sample of next sample sequence (e.g., sample "A1" 1524) may be processed. As shown in row 1589, RACC[0] 1565 may hold the value "A0R" the value resulting from processing sample A0 1520. The value "A0R" may be added (e.g., in adder 1567) to a value calculated for sample "A1" 1524 to produce a resulting accumulated value (e.g., "A1R") that may be stored in RACC[4] 1561 (as depicted in row 1590), overwriting value "D0R". After the store operation of row 1590, result data may be shifted through RACC[4:0] so that, for example, RACC[0] 1565 may now hold the value "B0R" as depicted in row 1591. The value "B0R" (e.g., the value resulting from the processing of sample "B0") held in RACC[0] 1565 may be supplied (e.g., to adder 1567 via connection 1569) to produce, for example, an accumulated value "B1R" for sample "B1" 1525, and accumulated value "B1R" may be stored (e.g., as depicted in row 1592) into RACC[4] 1561 overwriting "B0R". After the store operation of row 1592, result data may be shifted through RACC[4:0] so that, for example, RACC[0] 1565 may now hold the value "C0R" as depicted in row 1593. A resulting value "C1R" corresponding to sample "C1" 1526 may be similarly generated and stored (e.g., as illustrated in row 1594), followed by a rotation of stored data (e.g., as illustrated in row 1595). Similarly, for sample "D1" 1527, a resulting value "D1R" may be generated and stored (e.g., as illustrated in row 1596), followed by a shifting of stored data (e.g., as illustrated in row 1597). By row 1597, all the resulting data corresponding to sample sequence 1514 (e.g., resulting data "D0R, C0R, B0R, A0R") held in the accumulator registers RACC[3:0] may be overwritten with resulting data (e.g., "D1R, C1R, B1R, A1R") corresponding to samples from sample sequence 1516. In this manner, for each channel of a plurality of channels, results corresponding to successive samples from the channel may be accumulated together.

In some embodiments, the leading register of the result accumulator registers (e.g., RACC[3] 1501, RACC[4] 1561) may be used to accumulate the results of processing each sample. The results of processing each sample may be considered to be a current effective sample, where an effective sample may be, for example, an oversampling result and where a current effective sample may be, for example, an intermediate result in the calculation (e.g., generation, production) of an oversampling value.

For example, in a system with sixteen times oversampling, sixteen samples may be successively weighted and the results accumulated to produce one sample (e.g., a final effective sample). And, for each sample position in a non-final sample sequence (e.g., sample sequences one to fifteen), the results produced (e.g., intermediate results) may be considered a current effective sample for that sample position. For example, during the processing of sequence 1514 in FIG. 15B, sample D0 1523 may be processed and corresponding result D0R (which may be considered to be the current effective sample for channel "D") may be stored in RACC[4] (e.g., as depicted in line 1588 of FIG. 15E). And, during the processing of next successive sequence 1516 in FIG. 15B, sample D1 1527 (may be considered to be the current effective sample for channel "D") may be processed and corresponding result D1R may be stored in RACC[4] (e.g., as depicted in line 1596).

In some conditions, the results produced from processing a sample may be considered to be final results (e.g., may be considered final effective samples, may be considered oversampling results). For example, if sequence 1516 is a final sequence of a specified number of sample sequences (e.g., sequence 1516 is the second sequence of a group of two sequences, sequence 1516 is the sixteenth sequence of a group of sixteen sequences) then the results from processing each respective sample of the final sample sequence may be considered final results. And, after the final sample sequence has been processed, at least a portion of the accumulator registers (e.g., a portion of RACC[3:0] in FIG. 15A, a portion of RACC[4:0] in FIG. 15D) may hold results corresponding to respective sample positions in the sample sequences. For example, if sample sequence 1516 is a final sample sequence, then (as depicted in FIG. 15C) after sample D1 1527 has been processed and the results shifted, register RACC[3] 1501 may hold A1R which may be a final effective sample for channel "A", register RACC[2] 1502 may hold D1R which may be a final effective sample for channel "D", register RACC[1] 1503 may hold C1R which may be a final effective sample for channel "C" and register RACC[0] 1504 may hold B1R which may be a final effective sample for channel "B".

Similarly, as depicted in FIG. 15E for example, after sample D1 1527 (e.g., from sample sequence 1516) has been processed and the results shifted, register RACC[3] 1562 may hold D1R which may be a final effective sample for channel "D", register RACC[2] 1563 may hold C1R which may be a final effective sample for channel "C", register RACC[1] 1564 may hold B1R which may be a final effective sample for channel "B" and register RACC[0] 1565 may hold A1R which may be a final effective sample for channel "A".

Furthermore, processing a sample may involve multiplying the sample by a weighting factor (e.g., a filter coefficient, a coefficient value). In some embodiments (e.g., oversampling embodiments) multiple samples may be multiplied by respective coefficient values and the results accumulated. For example, in a system supporting sixteen times oversampling, each of the sixteen samples may be successively weighted (e.g., multiplied by respective weighting coefficient) and the results accumulated to produce a final effective sample. Accordingly, the sixteen coefficient values may be chosen (e.g., selected, predetermined, generated, used etc.) so that the sum of the sixteen coefficient values is equal to a specified value (e.g., one, a normalizing value, a scaling value). For example, in one embodiment, the following set of four coefficient values, totaling a value of one, (0.1, 0.4, 0.4, 0.1) may be used to weight four samples (e.g., to produce a final effective sample).

FIGS. 16A-16H and FIGS. 17A-17E

FIGS. 16A-16H and 17A-17E illustrate the generation of coefficients according to various embodiments. FIGS. 16A-16H are a collection of charts related to a simple exemplary weighting function. The charts of FIGS. 16A-16H illustrate that a weighting function may be constructed by convolving rectangle functions. In addition, the charts of FIGS. 16A-16H illustrate that a sufficiently differentiated weighting function may be a function consisting of a number of delta functions. In the charts of FIGS. 16 and 17, function amplitude (e.g., function value) is shown on the vertical axis and independent variable "t" shown on the horizontal axis, where "t" may refer to time (e.g., time in milliseconds).

Figure 16A:
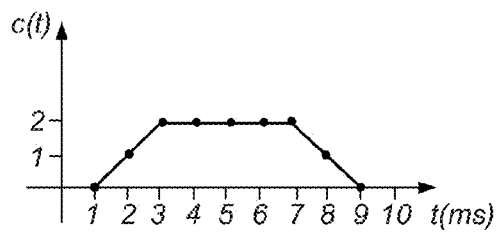
FIG. 16A-16H are charts illustrating various relationships between a weighting function, rectangle functions that may be convolved to form the weighting function and derivatives of weighting and rectangle functions.

FIG. 16A depicts an exemplary weighting function (e.g., coefficient function) c(t) which may provide a coefficient value (e.g., sample weighting value) during a specified time period (e.g., a time window, a sampling window, an oversampling window), that may be, for example, 8 mS in duration. Since the weighting function c(t) may be the result of convolving a 2 ms rectangle with a 6 ms rectangle, it may be suitable for generating a notch filter with a notch at 166.66 Hz (and its harmonics) and another notch at frequency 500 Hz (and its harmonics).

Figure 16B:
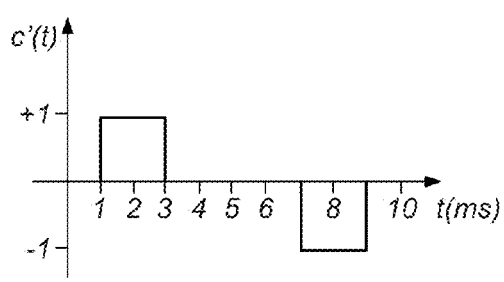

FIG. 16B may depict a first order derivative function c'(t) of the weighting function c(t) depicted in FIG. 16A, where c'(t) may be a time derivative of c(t). The function c'(t) may provide the slope of function c(t), which may be +1 when t falls between 1 mS and 3 mS and may be −1 when t falls between 7 mS and 9 mS.

Figure 16C:
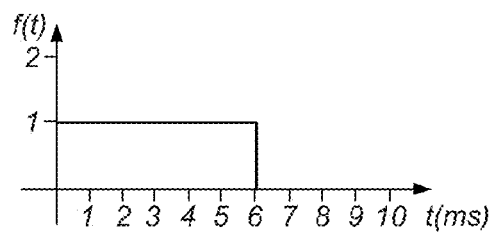

FIG. 16C may depict rectangle function f(t) that may, through convolution with a second function, create weighting function c(t). Function f(t), as depicted in chart 1620, may have a value of 1 when t falls between 0 mS and 6 mS.

Figure 16D:
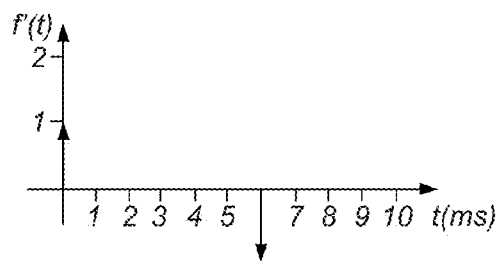

FIG. 16D may depict first order derivative function f'(t) of rectangle function f(t) as depicted in chart 1620. Since the slope of rectangle function f(t) may be considered infinite at time 0 mS and time 6 mS, derivative function f'(t), as depicted in chart 1630, may comprise delta functions at time 0 mS and time 6 mS.

Figure 16E:
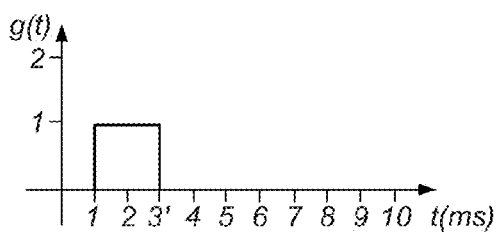

FIG. 16E may depict rectangle function g(t) that may, through convolution with function f(t), create weighting function c(t). Function g(t), as depicted in FIG. 16E, may have a value of 1 when t falls between 1 mS and 3 mS.

Figure 16F:
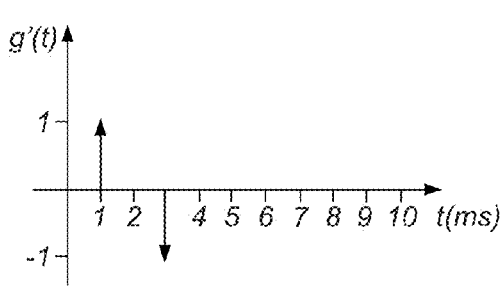

FIG. 16F may depict a first order derivative function g'(t) of rectangle function g(t) depicted in FIG. 16E. Since the slope of rectangle function g(t) may be considered infinite at time 1 mS and 3 mS, derivative function g'(t), as depicted in FIG. 16F, may comprise a delta function at time 1 mS and a delta function at time 3 mS.

Figure 16G:
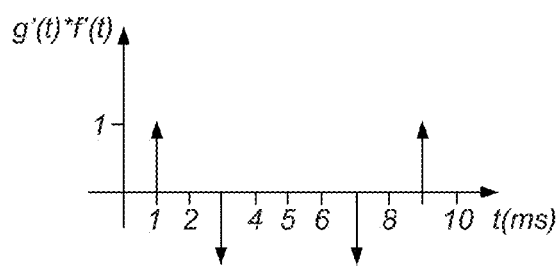

FIG. 16G may depict the function f'(t)*g'(t) (where "*" denotes the convolution operator) which may be produced, for example, by the convolution of derivative functions f'(t) and g'(t). The function f'(t)*g'(t), as depicted in FIG. 16G for example, may comprise two positive delta functions (e.g., one at time 1 ms, one at time 9 mS) and two negative delta functions (e.g., one at time 3 mS, one at time 7 mS).

Figure 16H:
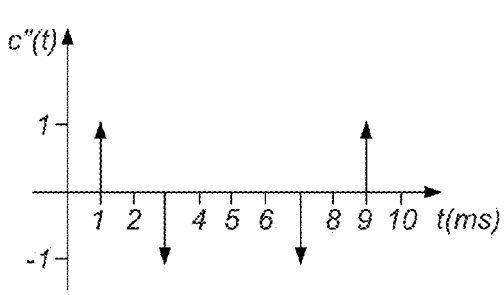

FIG. 16H may depict the function c"(t) which may be considered a first order derivative function of derivative function c' (t) (as depicted in FIG. 16B for example) and which may also be considered a second order derivative of function c(t) (as depicted FIG. 16A for example). The function c"(t), as depicted in FIG. 16H may be similar (e.g. identical) to the function g'(t)*f'(t) as depicted FIG. 16G, as it may similarly comprise two positive delta functions (e.g., one at time 1 ms, one at time 9 mS) and two negative delta functions (e.g., one at time 3 mS, one at time 7 mS).

The charts in FIGS. 16A-16H may illustrate that a weighting function, e.g., weighting function c(t), that may correspond to a convolution of rectangle functions, e.g., f(t)*g(t), may be successively differentiated to produce a derivative function, e.g., c"(t), that may be comprised a number of delta functions.

While exemplary function c(t), as depicted in FIG. 16A for example, may be a simple weighting function corresponding to a convolution of two rectangle functions, more complicated weighting functions may be similarly produced by convolving a larger number (e.g., 3, 6, etc.) of rectangle functions. Furthermore, a weighting function corresponding to specific number of convoluted rectangle functions (e.g., 3 rectangle functions, 6 rectangle functions, etc.) may be converted, for example, through a respectively similar or respectively identical number of differentiations (e.g., 3 differentiations, 6 differentiations, etc.) to a respectively similar order derivative function (e.g., a $3^{rd}$ order derivative function, $6^{th}$ order derivative function, etc.) comprising delta functions (e.g., consisting only of delta functions).

Figure 17A:
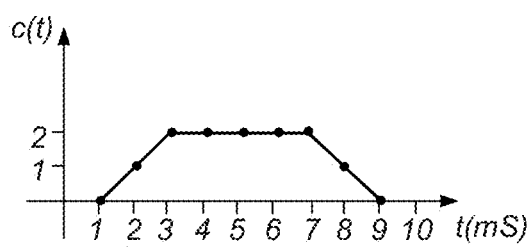
FIGS. 17A and 17B are charts, respectfully illustrating a weighting function and a second order derivative of the weighting function.
Figure 17B:
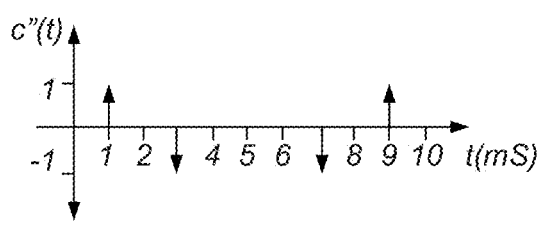

FIGS. 17A-17E may illustrate that a sequence of coefficient values corresponding to a weighting function may be produced from a base function that may correspond to a derivative of the weighting function. FIG. 17A may depict coefficient function c(t), as in FIG. 16A for example. FIG. 17B may depict a $2^{nd}$ order derivative function c"(t) as previously depicted in FIG. 16H, for example; and c"(t) may represent a base function.

Figure 17C:
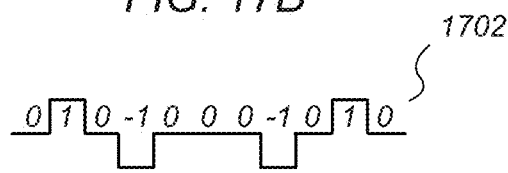
FIGS. 17C-17E respectfully show a first number sequence corresponding the second order derivative of the weighting function, a second number sequence corresponding a first order derivative of the weighting function and a third number sequence corresponding to the weighting function.

A number sequence 1702 corresponding to base function c"(t) may be produced, for example as shown FIG. 17C. Each successive number in number sequence 1702 may correspond to a value of base function c"(t) at a successively later time. For example, the first four numbers in sequence 1702 (e.g., 0,1,0,−1) may respectively represent the number of superimposed delta functions in base function c"(t) at 0 mS, 1 mS, 2 mS and 3 mS. It should be noted that the respective values of base function c"(t) at 1 mS and 3 mS, for example, may be plus or minus "infinite", stemming from representing continuous functions in the discrete domain. In other words, while the derivative of the edge of a rectangle would be represented by infinity (for an infinitesimal time) in the continuous domain, it would be represented by "1" in the discrete domain.

Figure 17D:
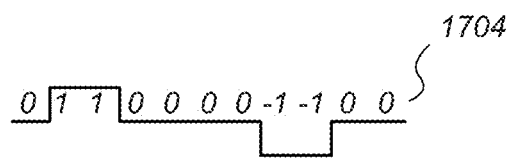

FIG. 17D depicts another number sequence 1704 that may correspond to an integral (e.g., accumulation) of base function c"(t). In some embodiments, number sequence 1704 may be generated (e.g., generated sequentially, calculated, generated coincidentally with number sequence 1702 being generated) from the number sequence 1702. In some embodiments, each number in number sequence 1704 may correspond to a respective, similarly positioned number in number sequence 1702. For example, the first, second and third numbers in number sequence 1704 may respectively correspond to the first, second and third numbers in number sequence 1702.

Each number in number sequence 1704 may be generated, according to certain embodiments, by accumulating (e.g., integrating) numbers in number sequence 1702 that precede (and include) a corresponding respective number (e.g., similarly positioned number) in number sequence 1702. For example, the fourth number in number sequence 1704 (e.g., zero) may be generated by accumulating the first four numbers in number sequence 1702 (e.g., zero, plus one, zero, minus one). Comparing successive numbers in number sequence 1704 to successive values of function c'(t) (e.g., as depicted in FIG. 16B) the number sequence 1704, as generated, for example, by the accumulation of a sequence of numbers corresponding to base function c"(t), may be found to correspond to function c'(t), a first integral function of base function c"(t).

Figure 17E:
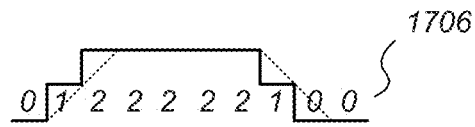

In a similar fashion, each number in number sequence 1706 shown in FIG. 17E may be generated, according to certain embodiments, by accumulating (e.g., integrating) numbers in number sequence 1704 that precede (and include) a corresponding respective number (e.g., similarly positioned number) in number sequence 1704. For example, the fourth number in number sequence 1706 (e.g., two) may be generated by accumulating the first four numbers in number sequence 1704 (e.g., zero, plus one, plus one, zero). Comparing successive numbers in number sequence 1706 to successive values of function c(t) (e.g., as depicted in FIG. 17A) the number sequence 1706, as generated, for example, by the accumulation of a sequence of numbers corresponding to function c'(t), may be found to correspond to weighting function c(t), e.g., a first integral function of function c'(t). Thus, by a process of two successive accumulations, a sequence of numbers corresponding to weighting function c(t) may be produced (e.g., sequentially, one at a time, in real time) from a base function corresponding to a $2^{nd}$ order derivative of the weighting function c(t).

FIG. 18

Figure 18:
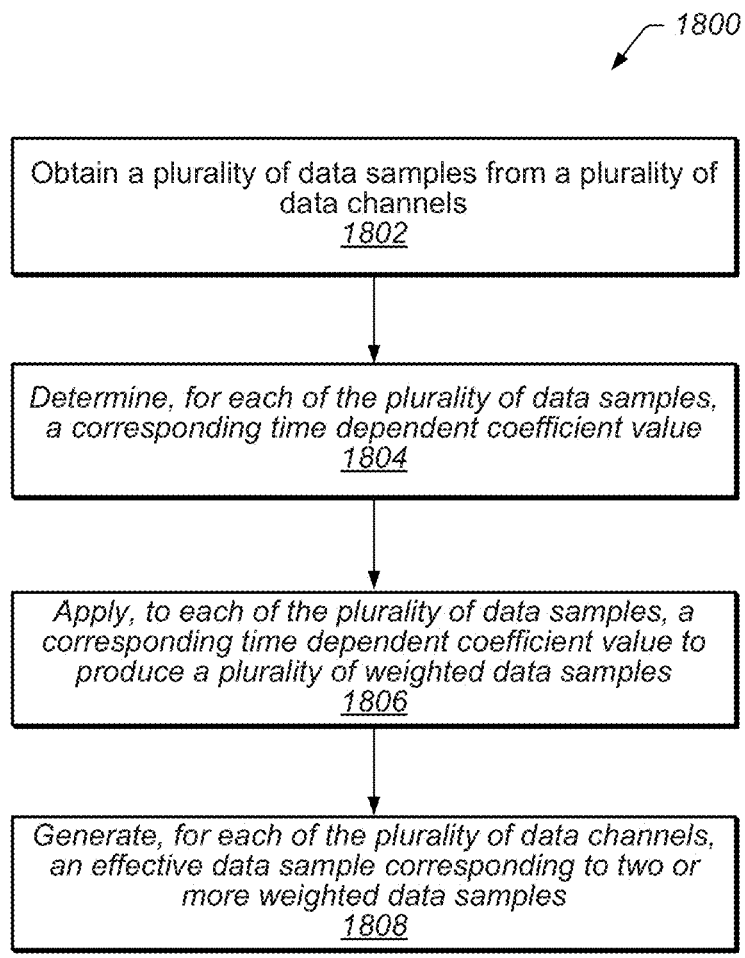
FIG. 18 is a flow chart illustrating a method for processing a plurality of data sets.

FIG. 18 depicts a flow chart 1800 that illustrates a method that may be used for processing data samples from multiple channels according to various embodiments. The method shown in FIG. 18 may be used in conjunction with any of the systems or devices shown in the above Figures, among other devices. In various embodiments, some of the method elements shown may be performed concurrently, performed in a different order than shown, or omitted.

As depicted in FIG. 18, the method may include block 1802 in which a plurality of data samples may be obtained (e.g., received, read from storage, read from a buffer, received in a sequence) from a plurality of channels. In some embodiments, the plurality of channels may be an ordered set of channels (e.g., each channel in the set different from other channels in the set and the channels arranged in a specified order).

The plurality of data samples may correspond to a plurality of data sets, where each data set may include a plurality of data samples and where each data set may correspond to data samples from a specified channel. Obtaining the plurality of data samples may involve receiving, in a sequence, each data sample of the plurality of data sets. The plurality of data samples may be a sequence of data samples (e.g., the plurality of data samples may be received as a sequence of data samples), and data samples may be arranged (e.g., ordered, received) within the sequence of data samples according to the time a corresponding signal was sampled to create the respective data sample.

Associated with each sample may be a respective sample time, and each sample time may be measured relative a specified reference point (e.g., relative the start of a corresponding integration period, relative to the sample time of a leading sample in an integration period). The specified reference point may be common to (e.g., the same for) samples from different channels. The specified reference point may be shared by samples corresponding to the same integration period. Further, each successive data sample in the sequence of data samples may correspond to a successively later sampling time (e.g., a sampling time greater by an amount corresponding to a sampling period). And data samples may be arranged within the sequence of data samples to correspond to the order of channels within the ordered set of channels so that, for example, adjacent data samples in the sequence of data samples correspond to different channels within the ordered set of channels.

The method may also, in some embodiments, include block 1804 in which a time-dependent coefficient value may be determined (e.g., generated, produced, calculated) for each data sample in the plurality of obtained data samples. The time dependent coefficient may be determined by first determining (e.g., identifying) a time associated with the data sample. In some embodiments, the time associated with a data sample (e.g., a relative sample time) may be indicated (e.g., identified) by the position of the data sample within a sequence of data samples. And, in certain embodiments, the position of a current data sample within a sequence of data samples may be identified by the current value of an index register that may be configured to count the number of data samples obtained (e.g., received) since the index register was last set to a specified value indicative of a leading data sample position within a sequence of data samples. In one or more embodiments, a coefficient value for a data sample (e.g., a current data sample) may be determined (e.g., produced, generated) using the current value of the index register.

In certain embodiments, a group of two or more consecutive samples in the sequence of data samples may correspond to different channels. Coefficients for each respective data sample of the group of two or more data samples (e.g., coefficients as determined by the sample time of each data sample and/or position of the data sample within the sequence of data samples) may be different so that, for example, neighboring (e.g., adjacent) data samples from different channels may be weighted differently. In some embodiments, coefficient values corresponding to a plurality of adjacent data samples (e.g., two adjacent samples, five adjacent data samples, two or more adjacent data samples corresponding to different channels) may each have different values. Also, for at least a portion of the determined coefficient values, each obtained coefficient value may be different from a most recent previously determined coefficient value. In some embodiments, the value of a time-dependent coefficient corresponding to a data sample may also depend on the channel corresponding to the data sample (e.g., to customize filtering according to a channel) and determining a time-dependent coefficient value may include identifying a corresponding channel for each obtained data sample.

In certain embodiments, the method may also include block 1806, which may follow block 1804 as depicted in FIG. 18. In block 1806, a time dependent coefficient may be applied to each data sample (e.g., each respective data sample corresponding to the time dependent coefficient) of the plurality of obtained data samples to produce a plurality (e.g., a plurality equal in number to the plurality of obtained data samples) of weighted data samples. A time dependent coefficient may be applied to a data sample in various ways and according to various embodiments. For example, a data sample may be multiplied by a corresponding coefficient value and/or a data sample may be arithmetically combined with a corresponding coefficient value and/or a data sample may be logically combined with the corresponding coefficient value and/or a data sample may be value limited according to the corresponding coefficient value.

According to one of more embodiments, the method may also include block 1808 which may (e.g., as depicted in FIG. 18) follow block 1806. In certain embodiments, block 1808 may involve generating, for each of two or more data channels in the plurality of data channels, an effective data sample from two or more weighted data samples corresponding to the respective data channel. An effective data sample may be generated for a plurality of data samples falling within a sampling window (e.g., a period used to repetitively sample signals corresponding to a plurality of channels). An effective data sample may be generated for each channel of the two or more channels and each effective data sample may have a corresponding effective sample time. A plurality of effective data samples (e.g., a plurality of effective data samples where each effective data sample corresponds to a different channel) that correspond to the same sampling window (e.g., period for repetitively sampling signals corresponding to a plurality of channels) may have similar effective sampling times. By applying a weighting coefficient that corresponds to the sample time (e.g., the sample time measured relative to a common reference for all channels) of each data sample, the effective sample times of a plurality of effective data samples (e.g., where each different effective data sample in the plurality of effective data samples corresponds to a different channel) may be more closely aligned.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above described embodiment are characterized as transmitted from one block to the next, other embodiments of the present disclosure may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

The foregoing description, for purposes of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable other skilled in the art to best utilize the invention and various embodiments with various modifications as may be suited to the particular use contemplated.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for processing data samples corresponding to a plurality of data channels, the method comprising:
obtaining, by data acquisition circuitry, a plurality of data samples derived from corresponding electrical signals received by the plurality of data channels, said obtaining comprising successively receiving a respective data sample corresponding to each data channel serially at a serial input port, said obtaining further comprising performing said successively receiving a plurality of times during a specified time period, wherein each respective data sample is obtained at a respective sample time, and wherein each respective sample time is relative to a single specified reference point in time; and
for each respective data sample:
determining, by a data processing circuit, a respective channel-dependent coefficient value corresponding to the respective sample time at which the respective data sample is obtained; and
applying by the data processing circuit, the respective channel-dependent coefficient value to the respective data sample to phase align the plurality of data channels.

2. The method of claim 1, wherein the single specified reference point in time is located within the specified time period.

3. The method of claim 1, wherein the single specified reference point in time corresponds to a start of the specified time period.

4. The method of claim 1, wherein said obtaining the plurality of data samples comprises receiving the plurality of data samples at a specified rate.

5. The method of claim 1, wherein said successively receiving is according to a specified order corresponding to a specified ordering of the plurality of data channels.

6. The method of claim 1, wherein said applying comprises multiplying the respective data sample by the respective channel-dependent coefficient value to produce a respective weighted data sample.

7. The method of claim 6, further comprising:
for each data channel of one or more data channels of the plurality of data channels:
generating a respective effective data sample from two or more respective weighted data samples corresponding to the data channel.

8. The method of claim 7, wherein said generating comprises arithmetically combining the two or more respective weighted data samples.

9. An apparatus for processing a sequence of data samples, the apparatus comprising:
a serial input port configured to serially receive a plurality of data samples derived from corresponding electrical signals that are received by a plurality of data channels, wherein to serially receive the plurality of data samples, the serial input port is configured to:
successively receive a respective data sample corresponding to each data channel a plurality of times during a specified time period, wherein each respective data sample is obtained at a respective sample time, and wherein each respective sample time is relative to a single specified reference point in time; and
first circuitry configured to:
for each respective data sample, determine a respective channel-dependent coefficient value corresponding to the respective sample time at which the respective data sample is obtained; and
for each respective data sample, apply the respective channel-dependent coefficient value to the respective data sample to phase align the plurality of data channels.

10. The apparatus of claim 9, wherein the single specified reference point in time is located within the specified time period.

11. The apparatus of claim 9, wherein the single specified reference point in time corresponds to a start of the specified time period.

12. The apparatus of claim 9, wherein the serial input port is configured to receive the plurality of data samples at a specified rate.

13. The apparatus of claim 9, wherein the serial input port is configured to successively receive a respective data sample corresponding to each data channel in a specified order corresponding to a specified ordering of the plurality of data channels.

14. The apparatus of claim 9, wherein to apply the respective channel-dependent coefficient value to the respective data sample, the first circuitry is configured to multiply the respective data sample by the respective channel-dependent coefficient value to produce a respective weighted data sample.

15. The apparatus of claim 14, wherein the first circuitry is further configured to:
for each data channel of one or more data channels of the plurality of data channels, generate a respective effective data sample from two or more respective weighted data samples corresponding to the data channel.

16. The apparatus of claim 15, wherein to generate a respective effective data sample from two or more respective weighted data samples corresponding to the data channel, the first circuitry is configured to arithmetically combine the two or more respective weighted data samples.

17. A data acquisition and processing system, the system comprising:
a front-end circuit configured to provide a serial data stream comprising a plurality of data samples derived from corresponding electrical signals received by a plurality of data channels; and a data processing circuit having a serial input port and configured to:

serially receive the serial data stream at the serial input port, wherein to serially receive the serial data stream, the data processing circuit is configured to successively receive a respective data sample corresponding to each data channel a plurality of times during a specified time period, wherein each data sample of the plurality of data samples is obtained at a respective sample time, and wherein each respective sample time is relative to a single specified reference point in time; and for each respective data sample, determine a respective channel-dependent coefficient value corresponding to the respective sample time at which the respective data sample is obtained; and for each respective data sample, apply the respective channel-dependent coefficient value to the respective data sample to phase align the plurality of data channels.

18. The system of claim 17, wherein the front-end circuit comprises:

an analog front end module comprising the plurality of data channels, wherein each data channel of the plurality of data channels is configured to receive a corresponding respective analog signal;

wherein the data processing circuit comprises an analog-to-digital converter (ADC) configured to generate the plurality of data samples based on each corresponding respective analog signal.

19. The system of claim 17, wherein the front-end circuit is configured to generate the plurality of data samples in a specified order corresponding to a specified ordering of the plurality of data channels.

20. The system of claim 17, wherein the data processing circuit is configured to:

multiply the respective data sample by the respective channel-dependent coefficient value to produce a respective weighted data sample when applying the respective channel-dependent coefficient value to the respective data sample; and for each data channel of one or more data channels of the plurality of data channels, generate a respective effective data sample from two or more respective weighted data samples corresponding to the data channel.

* * * * *